US008081499B2

(12) United States Patent
Takahashi et al.

(10) Patent No.: US 8,081,499 B2

(45) Date of Patent: Dec. 20, 2011

(54) SEMICONDUCTOR INTEGRATED CIRCUIT

(75) Inventors: Mitsue Takahashi, Tsukuba (JP); Shigeki Sakai, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 617 days.

(21) Appl. No.: 11/912,184

(22) PCT Filed: Apr. 13, 2006

(86) PCT No.: PCT/JP2006/307850

§ 371 (c)(1), (2), (4) Date: Apr. 21, 2008

(87) PCT Pub. No.: WO2006/115075

PCT Pub. Date: Nov. 2, 2006

(65) Prior Publication Data

US 2009/0059646 A1 Mar. 5, 2009

(30) Foreign Application Priority Data

Apr. 22, 2005 (JP) ................................ 2005-124805

(51) Int. Cl.
*G11C 11/22* (2006.01)
*G11C 11/24* (2006.01)

(52) U.S. Cl. ....................................... 365/145; 365/149

(58) Field of Classification Search .................. 365/145, 365/149

See application file for complete search history.

(56) References Cited

U.S. PATENT DOCUMENTS

| | | | | |
|---|---|---|---|---|
| 4,161,038 | A * | 7/1979 | Wu | 365/145 |
| 5,886,920 | A * | 3/1999 | Marshall et al. | 365/145 |
| 5,956,266 | A * | 9/1999 | Wilson et al. | 365/145 |
| 6,028,784 | A * | 2/2000 | Mori et al. | 365/145 |
| 6,240,013 | B1 * | 5/2001 | Nishimura | 365/145 |
| 6,498,742 | B2 * | 12/2002 | Chu | 365/145 |
| 6,944,044 | B2 * | 9/2005 | Goebel et al. | 365/145 |

FOREIGN PATENT DOCUMENTS

| | | |
|---|---|---|
| JP | 4-256361 | 9/1992 |
| JP | 8-8408 | 1/1996 |
| JP | 9 107041 | 4/1999 |
| JP | 2000 77986 | 3/2000 |
| JP | 2001 229685 | 8/2001 |
| JP | 2003-68890 | 3/2003 |

* cited by examiner

*Primary Examiner* — Trong Phan

(74) *Attorney, Agent, or Firm* — Oblon, Spivak, McClelland, Maier & Neustadt, L.L.P.

(57) ABSTRACT

A field-effect transistor for nonvolatile memory holding use and a field-effect transistor for logical operation use are manufactured in the same structure on the same semiconductor substrate without separately providing manufacturing processes for the field-effect transistors for the two uses. Both a memory circuit and a logic circuit of a semiconductor integrated circuit are composed of n-channel and p-channel field-effect transistors including a memory holding material in a gate insulating structure. A logical operation state, a memory writing state and a nonvolatile memory holding state are electrically switched by controlling the level and application timing of a voltage to be applied between a gate conductor and a substrate region of the n-channel and p-channel field-effect transistors including the memory holding material in the gate insulating structure.

32 Claims, 18 Drawing Sheets

200

201 Logical Circuit Part

202 SRAM Part

203 DRAM Part

204 NVRAM Part (a)

(b)

Potential Difference Voltage between gate conductor and n-type substrate region

Potential Difference Voltage between gate conductor and n-type substrate region (a)

Potential Difference Voltage between gate conductor and p-type substrate region (b)

Potential Difference Voltage between gate conductor and p-type substrate region

Potential Difference Voltage between gate conductor and n-type substrate region

Potential Difference Voltage between gate conductor and n-type substrate region (a)

(b)

(a)

(b)

SEMICONDUCTOR INTEGRATED CIRCUIT

TECHNICAL FIELD

This invention relates to a semiconductor integrated circuit and particularly relates to a field-effect transistor provided in a gate insulating structure with a ferroelectric film and a charge retention layer, namely a semiconductor integrated circuit having a gate insulating structure containing a field-effect transistor possessing a memory holding function and adapted to utilize both the non-hysteresis characteristics and the hysteresis characteristics of the field-effect transistor.

BACKGROUND ART

The semiconductor integrated circuit that has mounted on the same substrate together a field-effect transistor provided in a gate insulating structure with a memory holding layer and a field-effect transistor not provided in a gate insulating structure with a memory holding layer is known in the following types.

As the first conventional example, a nonvolatile memory array circuit is proposed, which circuit uses as a control transistor a field-effect transistor not provided in a gate insulating structure with a memory holding layer and possessing no memory holding function, uses as a nonvolatile memory transistor a field-effect transistor provided in a gate insulating structure with a memory holding layer containing a ferroelectric layer and configures an array structure having a multiplicity of such memory transistors arranged regularly longitudinally and laterally (refer, for example, to Patent Document 1).

As the second conventional example, a programmable nonvolatile logic array circuit has been known, which circuit arranges in the form of an array field-effect transistors not provided in a gate insulating layer with a memory holding layer and possessing no memory holding function, possesses as a selection transistor a field-effect transistor provided in a gate insulating structure with a memory holding layer containing a ferroelectric layer, selects part of the field-effect transistors possessing no memory holding function with the field-effect transistor provided in a gate insulating structure with a memory holding layer and mutually connects the selected field-effect transistors to construct a logical circuit, and subjects the information of this connection to nonvolatile memory (refer, for example, to Patent Document 2).

As the third conventional example, a nonvolatile logic circuit has been proposed, which circuit constructs a latch circuit with field-effect transistors provided in a gate insulating structure with a memory holding layer and causes a result of operation taking place in a logical operation circuit constructed with field-effect transistors not provided in a gate insulating structure with a memory holding layer and possessing no memory holding function to be memorized in the latch circuit (refer, for example, to Patent Document 3).

Patent Document 1: JP-A 2001-229685

Patent Document 2: JP-A HEI 09-107041

Patent Document 3: JP-A 2000-077986

DISCLOSURE OF THE INVENTION

Problems to be solved by the Invention

The nonvolatile memory array circuit, the programmable nonvolatile logic array circuit, and the nonvolatile logic circuit mentioned above have been using field-effect transistors containing special materials, such as bismuth and lead, as the material for a gate insulating structure, requiring a process of production different from the process for producing field-effect transistors possessing no memory holding function, and possessing a nonvolatile memory holding function besides the field-effect transistors heretofore made solely of silicon, silicon oxide and silicon nitride and possessing no memory holding function.

The production on the same semiconductor substrate of at least two kinds of field-effect transistors differing in the material for a gate insulating structure and the process of production, i.e. a field-effect transistor possessing a nonvolatile memory holding function for use in a memory circuit and a field-effect transistor not possessing a memory holding function for use in a logical operation circuit, therefore, has entailed the problem that the number of steps for the production is markedly larger than when the same kind of field-effect transistors are produced on the same semiconductor substrate.

The production of the at least two kinds of field-effect transistors on the same semiconductor substrate has aroused the fear that the contamination by dispersion of the special materials, such as silicon, silicon oxide and silicon nitride, results in degrading the yield.

For the purpose of suppressing the degradation of the yield due to the contamination of dispersion, it is necessary that the configuration space on the semiconductor substrate between mutually different kinds of field-effect transistors be wider than the configuration space on the semiconductor substrate between the field-effect transistors of the same kind. This necessity has entailed the problem that the layout area is enlarged.

For the purpose of suppressing the increase of the layout area on the semiconductor substrate in the case of arranging at least two kinds of field-effect transistors on the same semiconductor substrate, the circuit expected to possess both a memory function and a logical operation function as a whole has been realized by a layout that configures a memory region gathering individual field-effect transistors at one portion or in a region consisting of several points limited in advance and wiring them so as to allow individual selection of the field-effect transistors possessing a nonvolatile memory holding function and connects the memory circuit region by extending or intersecting wirings to a logic circuit region configured with field-effect transistors possessing no memory holding function and disposed as gathered at a place separated from the memory circuit region. This layout has entailed the problem that the layout area is increased because the wires are laid around between the memory circuits and the logic circuits.

The task imposed on this invention resides in solving the problems confronting the conventional techniques as described above. It is aimed firstly at enabling the production of a semiconductor integrated circuit possessing field-effect transistors provided with a nonvolatile memory holding function without entailing an increase in the number of steps of production, secondly at suppressing the degradation of yield due to the contamination by dispersion of materials, and thirdly at enabling the production of a semiconductor integrated circuit possessing field-effect transistors provided with a nonvolatile memory holding function without adding to the layout area.

Means for Solving the Problems

With a view to accomplishing the objects mentioned above, this invention provides a semiconductor integrated circuit comprising a substrate region provided therein with a source region and a drain region, a gate insulating structure on the substrate, a gate conductor on the gate insulating structure and a field-effect transistor capable of assuming a first operation state wherein a voltage-drain current property between the gate conductor and the substrate region exhibits non-hysteresis characteristics or pseudo non-hysteresis characteristics and a second operation state wherein the voltage-drain current property exhibits hysteresis characteristics and operated as switched between the first operation state and the second operation state.

Also with a view to accomplishing the objects mentioned above, this invention provides a semiconductor integrated circuit comprising a substrate region provided therein with a source region and a drain region, a gate insulating structure on the substrate region, a gate conductor on the gate insulating structure and a plurality of field-effect transistors divided into a first group and a second group and capable of assuming a first operation state wherein a voltage-drain current property between the gate conductor and the substrate region exhibits non-hysteresis characteristics or pseudo non-hysteresis characteristics and a second operation state wherein the voltage-drain current property exhibits hysteresis characteristics, the field-effect transistors belonging to the first group being operated in the first operation state and the field-effect transistors belonging to the second group being operated in the second operation state.

Effects of the Invention

This invention shortens and simplifies the process of production because it enables production in the same structure on the same semiconductor substrate field-effect transistors for use in holding a nonvolatile memory and field-effect transistors for use in logical operation or for use in control without requiring the process for producing field-effect transistors for use in holding a nonvolatile memory and the process for producing field-effect transistors for use in logical operation or for use in control to be carried out separately. Further, it can be expected to improve the yield because it solves the problem of the contamination due to the dispersion of materials used for the production. It is capable of avoiding the problem that the layout area is increased for the purpose of securing configuration space on a semiconductor substrate between mutually different kinds of field-effect transistors and the layout area is increased because wires are laid around between memory circuits and logic circuits.

EXPLANATION OF REFERENCE NUMERALS

Figure 1:
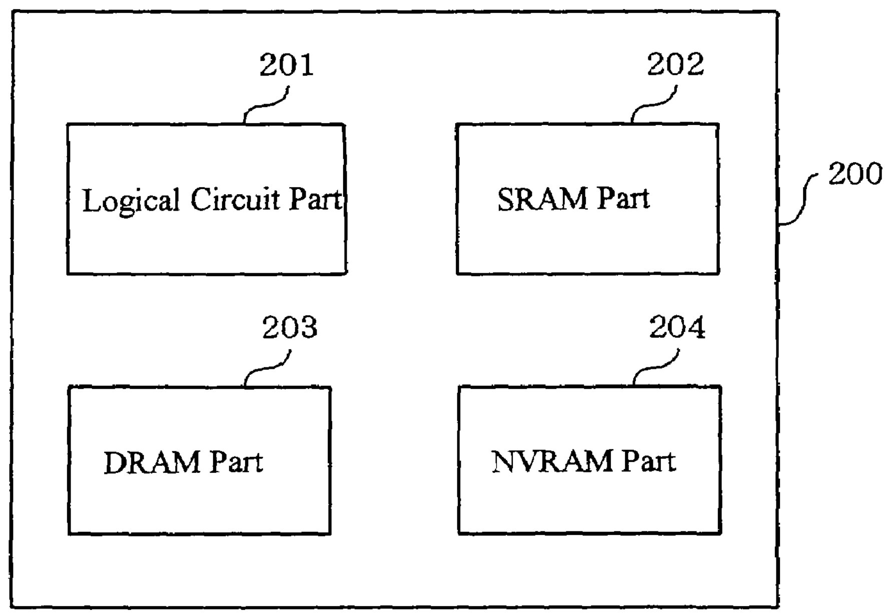
FIG. 1 It is a block diagram illustrating the first embodiment of this invention.

11 Gate conductor
12 Gate insulating structure
13 n-type source region
14 n-type drain region
15 p-type substrate region
16 Gate terminal
17 Source terminal
18 Drain terminal
19 p-type substrate terminal
21 First non-hysteresis curve
22 First hysteresis curve
23 Second hysteresis curve
31 Gate conductor
32 Gate insulating structure
33 p-type source region
34 p-type drain region
35 n-type substrate region
36 Gate terminal
37 Source terminal
38 Drain terminal
39 n-type substrate terminal
41 Second non-hysteresis curve
42 Third hysteresis curve
43 Fourth hysteresis curve
51 Control transistor
52 Memory transistor
53 First word line
54 Second word line
55 Source line
56 Bit line
61 Memory transistor
62 Word line
63 Source line
64 Bit line
101 Resisting element
102 Switch circuit element
103 Control terminal
104 Output terminal
105 Input terminal
106 Resisting element
107 Switch circuit element
108 Control terminal
109 Output terminal
110 Input terminal
111 n-channel field-effect transistor
112 p-channel field-effect transistor
113 Switch circuit element
114, 115 Control terminals
116, 117 Switch circuit elements
118, 119 Control terminals
120 Switch circuit element
121, 122 Input voltages
151, 152 Resisting elements
181 Arithmetic register
182 Arithmetic circuit
183 Instruction register
184 Instruction decoder
185 Control signal forming circuit
186 General purpose register
187 Program counter
188 Address control circuit
189 Bus
190 Memory
191 Input-output interface
192 Arithmetic part
193 Control part
200, 300, 400 Semiconductor integrated circuits
201, 301, 401 Logical circuit parts
202, 402 SRAM parts
203, 403 DRAM parts
204, 404 NVRAM parts

BEST MODE FOR CARRYING OUT THE INVENTION

Now, preferred embodiments of this invention will be described in detail below by reference to the accompanying drawings.

FIG. 1 is a block diagram illustrating a semiconductor integrated circuit in the first embodiment of this invention. On a semiconductor integrated circuit 200 of the present embodiment, a logical circuit part 201 for performing a logical operation, an SRAM part 202 having formed an SRAM exhibiting volatility and requiring no refresh, a DRAM part 203 having formed a DRAM exhibiting volatility and requiring refresh, and an NVRAM part 204 having formed a nonvolatile memory are mounted. The transistors that construct these circuit parts 201 to 204 are n-channel field-effect transistors or p-channel field-effect transistors to be explained herein below by reference to FIG. 4 and FIG. 6. These transistors acquire a memory holding function by being provided in a gate insulating structure with a ferroelectric film, for example, and enable the gate voltage-drain current property to describe hysteresis curves. When the voltage between the gate-substrate regions falls in a prescribed range, however, no hysteresis curve is drawn (non-hysteresis curve) or, if drawn at all, only a hysteresis curve having a small current difference between the time the gate voltage is raised and the time it is lowered is drawn (pseudo non-hysteresis curve). The transistors that are used in the logical circuit part 201, the SRAM part 202 and the DRAM part 203 in the present embodiment utilize the characteristic of non-hysteresis curve or pseudo non-hysteresis curve. The logical circuit part 201, the SRAM part 202 and the DRAM part 203, therefore, assume the same circuit structure and perform the same circuit operation as the circuits using ordinary MOS transistors.

The transistor that performs a memory holding function in the NVRAM part 204 utilizes the characteristic of drawing a hysteresis curve. The NVRAM part results from causing memory cells of structures explained herein below by reference to FIG. 13 and FIG. 14 regularly arranged longitudinally and laterally.

The present embodiment, as described above, has mounted as mixed the transistors utilizing only the characteristic of drawing a non-hysteresis curve or a pseudo non-hysteresis curve and the transistors utilizing only the characteristic of drawing a hysteresis curve.

Figure 2:
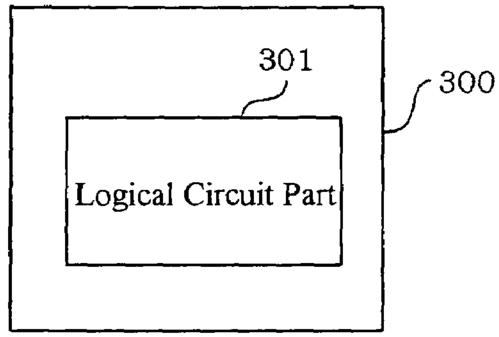
FIG. 2 It is a block diagram illustrating the second embodiment of this invention.

FIG. 2 is a block diagram illustrating a semiconductor integrated circuit of the second embodiment. On a semiconductor integrated circuit 300 of the present embodiment, only a logical circuit part 301 performing a logical operation is mounted. The logical circuit part 301 incorporates a transistor possessing a memory holding function involved in the preceding embodiment and the gate voltage-drain current property of the transistor possessing this memory holding function draws a hysteresis curve similarly to the case of preceding embodiment. The logical circuit part 301, in terms of the mode of operation, operates in the logical operation mode, the memory write mode and the memory holding mode. The transistors that possess the memory holding function belonging to the logical circuit part 301 are used in the characteristic of the non-hysteresis curve or the pseudo non-hysteresis curve. In the memory read mode, part or all the transistors that possess the memory holding function belonging to the logical circuit part 301 memorize the logical state immediately prior to the transfer to the memory write mode used in the characteristic of hysteresis curve. In the memory holding mode, the transistors that have memorized the logical state conserve the contents thereof. In the case of returning to the logical operation mode, the transistors that have memorized the logical state is transferred to the logical operation mode while conserving the contents of memory and returned to the ordinary logical operation mode.

In the present embodiment, the transistors that utilize only the characteristic of drawing a non-hysteresis curve or pseudo non-hysteresis curve and the transistors that utilize both the characteristic of drawing a non-hysteresis curve or pseudo non-hysteresis curve and the characteristic of drawing a hysteresis curve are mounted as mixed.

Figure 3:
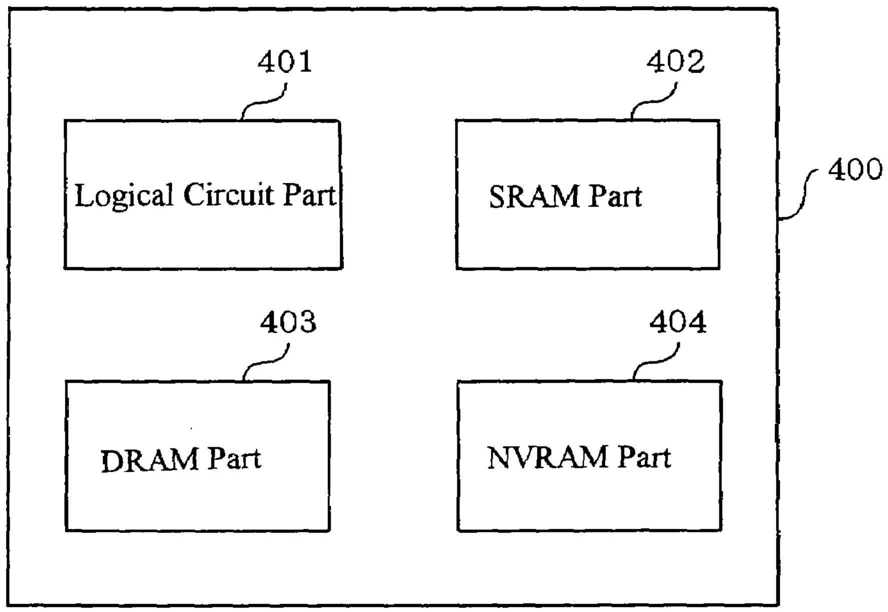
FIG. 3 It is a block diagram illustrating the third embodiment of this invention.

FIG. 3 is a block diagram illustrating a semiconductor integrated circuit of the third embodiment. On a semiconductor integrated circuit 400 of the present embodiment, a logical circuit part 401 for performing a logical operation, an SRAM part 402 having formed the SRAM of a volatile memory, a DRAM part 403 having formed DRAM as a similarly volatile memory and an NVRAM part 404 having formed a nonvolatile memory are mounted. The transistors that construct the circuit parts 401 to 404 are n-channel field-effect transistors or p-channel field-effect transistors acquiring a memory holding function by being provided in a gate insulating structure with a ferroelectric film, for example, similarly to the case of the preceding embodiment.

In the circuit of the present embodiment, the logical circuit part 401 performs the same operation as the logical circuit part 301 in the second embodiment and the SRAM part 402, the DRAM part 403 and the NVRAM part 404 perform the same operations as the corresponding circuits in the first embodiment. In the present embodiment, therefore, the transistors that utilize only the characteristic of drawing non-hysteresis curve or pseudo non-hysteresis curve, the transistors that utilize only the characteristic of drawing hysteresis curve, and the transistors that utilize both the characteristic of drawing non-hysteresis curve or pseudo non-hysteresis curve and the characteristic of drawing hysteresis curve are mounted as mixed.

Figure 4:
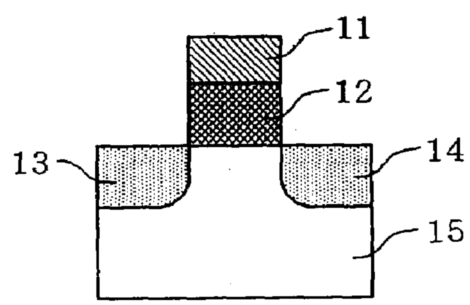
FIGS. 4(*a*) and 4(*b*) They show a device structure of an n-channel field-effect transistor used in the embodiment of this invention and circuit symbols.
Figure 4:
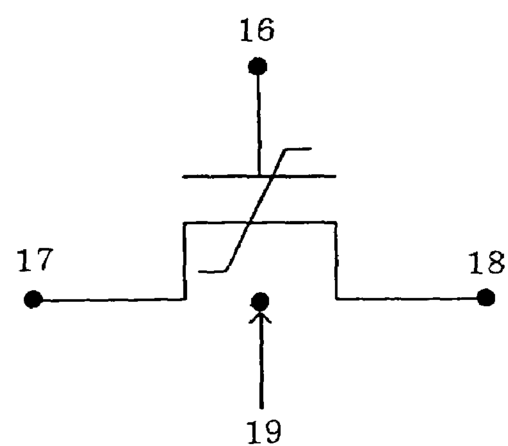

Now, the special properties of the transistors that are used in the semiconductor integrated circuit of this invention will be described below. The n-channel field-effect transistor that is used in the semiconductor integrated circuit of this invention and can freely switch electrically the state among the logical operation state, the memory writing state and the nonvolatile memory holding state is obtained, as illustrated in FIG. 4(*a*) depicting one example of the structure, by causing both a gate insulating structure 12 containing a memory holding layer and a gate conductor 11 to be sequentially stacked in the order mentioned on an n-type source region 13, an n-type drain region 14 and a p-type substrate region 15 that is p-type region, such as a p-type semiconductor substrate or a p-type well region of the semiconductor substrate or a semiconductor layer of the SOI substrate. Then, as illustrated in FIG. 4(*b*) representing an equivalent circuit schematic, the gate conductor 11 is connected to a gate terminal 16, the n-type source region 13 is connected to a source terminal 17, the n-type drain region 14 is connected to a drain terminal 18, and the p-type substrate region 15 is connected to a p-type substrate terminal 19.

Figure 5:
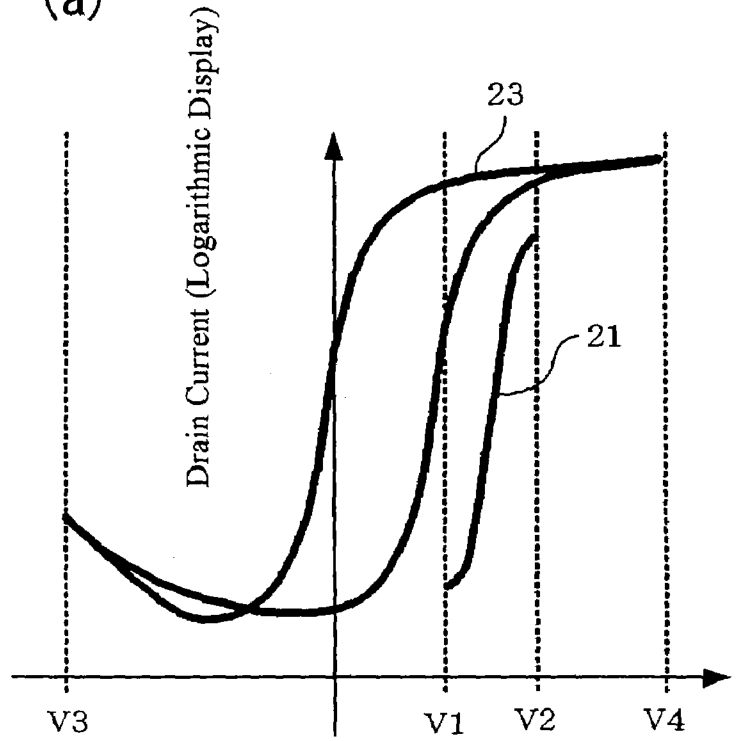
FIGS. 5(*a*) and 5(*b*) They are a schematic view (Part 1) of the electric characteristics of an n-channel field-effect transistor used in the embodiment of this invention.
Figure 5:
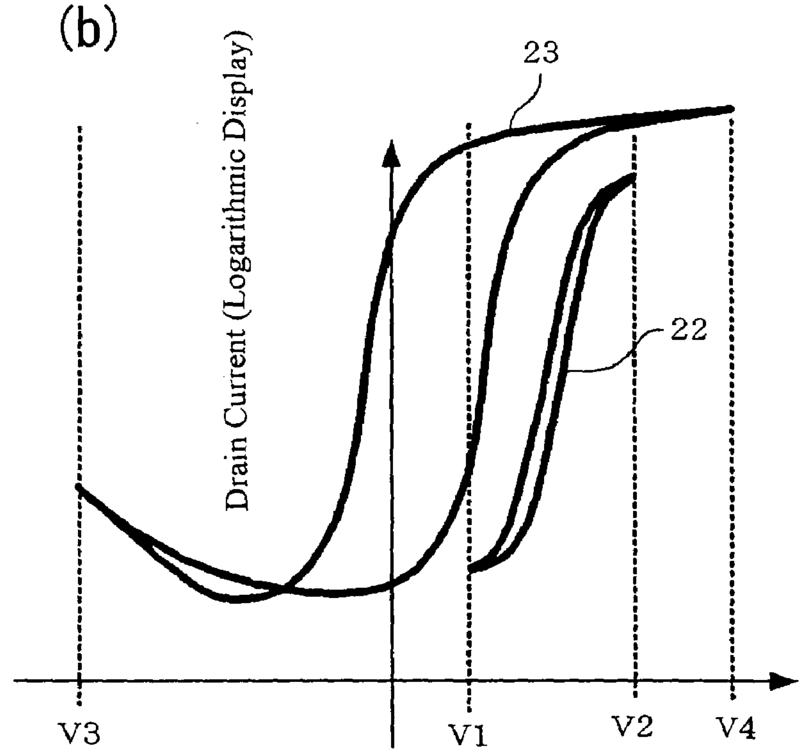

Each of examples of the graphical curves represented in FIGS. 5(*a*) and 5(*b*) shows the dependency of the absolute value of the drain current on the voltage of the difference in electric potential between the gate conductor and the p-type substrate region. The drain current is a current flowing into the n-type drain region 14 from the external conductor connected to the n-type drain region in consequence of impartation of a positive voltage by the external conductor to the electric potential difference between the drain and the source. The voltage of the difference in electric potential between the gate conductor and the p-type substrate region is the potential of the gate conductor 11 relative to the p-type substrate region 15. In these figures, the axis of ordinate stands for the absolute value of the drain current and the axis of abscissas stands for the voltage of the difference in electric potential between the gate conductor and the p-type substrate region. When the voltage of the difference in electric potential between the gate conductor and the p-type substrate region falls between a first voltage V1 and a second voltage V2, the absolute value of the drain current assumed in response to the second voltage V2 is larger than the absolute value of the drain current assumed in response to the first voltage V1. That is to say, the resistance between the drain and the source decreases. A first non-hysteresis curve 21, in which the graphical curve drawn in consequence of increasing the electric potential difference from the first voltage V1 to the second voltage V2 and the graphical curve drawn in consequence of decreasing it from the second voltage V2 to the first voltage V1 coincide, or a first hysteresis curve 22, in which they approximate or fail to coincide, is drawn. When the voltage of the difference in electric potential between the gate conductor and the p-type substrate region falls between a third voltage V3 and a fourth voltage V4, a second hysteresis curve 23, in which the graphical curve drawn in consequence of increasing the voltage of the difference in electric potential between the gate conductor and the p-type substrate region from a third voltage V3 to a fourth voltage V4 and the graphical curve drawn in consequence of decreasing it from the fourth voltage V4 to the third voltage V3 fail to coincide, is drawn.

Figure 6:
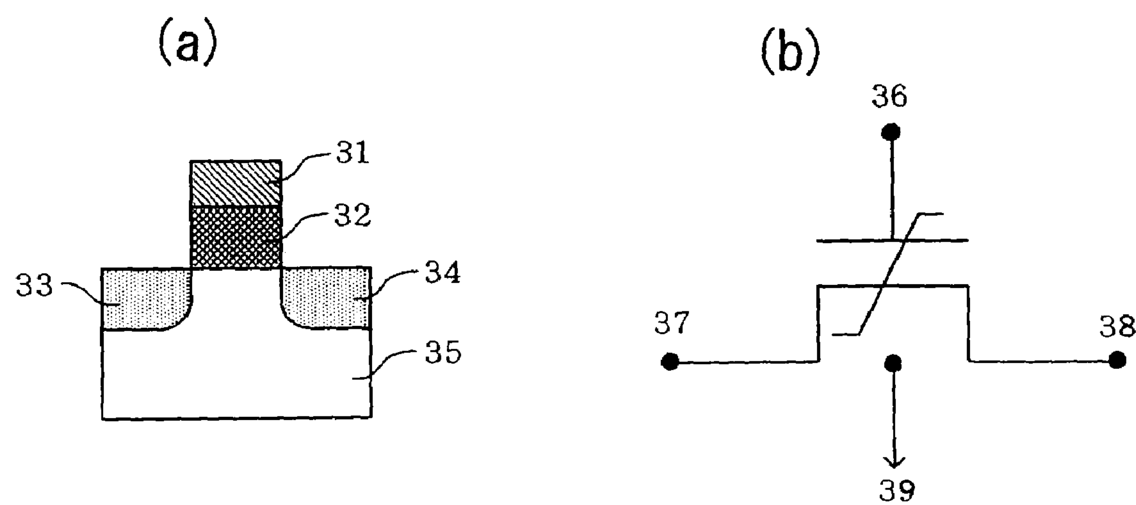
FIGS. 6(*a*) and 6(*b*) They show a device structure of a p-channel field-effect transistor used in the embodiment of this invention and circuit symbols.

One example of the structure of the p-channel field-effect transistor that is used in the semiconductor integrated circuit of this invention and can freely switch the logical operation state, the memory write state and the nonvolatile memory holding state electrically is as illustrated in FIG. 6(*a*). It comprises a gate insulating structure 32 containing a memory holding layer and a gate conductor 31 that are sequentially stacked in the order mentioned on a p-type source region 33, a p-type drain region 34 and an n-type substrate region 35 that is an n-type semiconductor substrate, an n-type well region of a semiconductor substrate or a semiconductor layer of an SOI substrate. As illustrated in an equivalent circuit schematic of FIG. 6(*b*), the gate conductor 31 is connected to a gate terminal 36, the p-type source region 33 to a source terminal 37, the p-type drain region 34 to a drain terminal 38, and the n-type substrate region 35 to an n-type substrate terminal 39.

Figure 7:
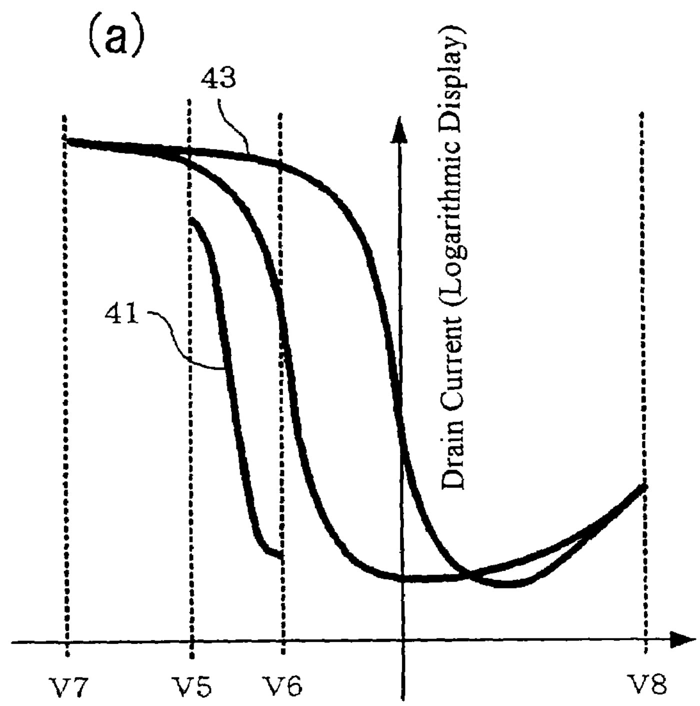
FIGS. 7(*a*) and 7(*b*) They are schematic views (Part 1) of the electric characteristics of a p-channel field-effect transistor used in the embodiment of this invention.
Figure 7:
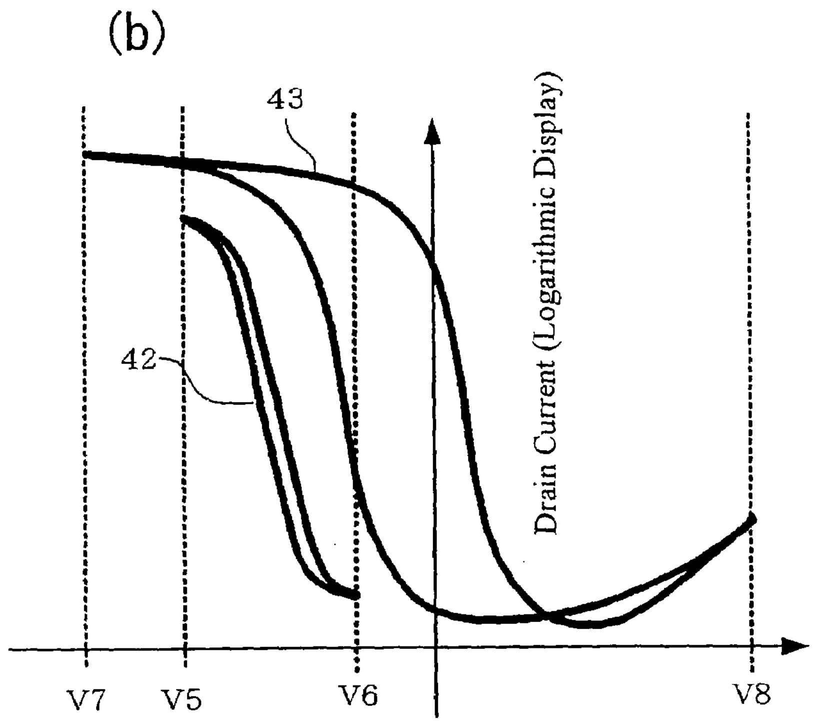

Each of examples of the graphical curves represented in FIGS. 7(*a*) and 7(*b*) shows the dependency of the absolute value of the drain current on the voltage of the difference in electric potential between the gate conductor and the n-type substrate region. The drain current is a current flowing into the p-type drain region 34 from the external conductor connected to the p-type drain region in consequence of impartation of a negative voltage by the external conductor to the electric potential difference between the drain and the source. The voltage of the difference in electric potential between the gate conductor and the n-type substrate region is the potential of the gate conductor 31 relative to the n-type substrate region

35. In these figures, the axis of ordinate stands for the absolute value of the drain current and the axis of abscissas stands for the voltage of the difference in electric potential between the gate conductor and the n-type substrate region. When the voltage of the difference in electric potential between the gate conductor and the n-type substrate region falls between a fifth voltage V5 and a sixth voltage V6, the absolute value of the drain current assumed in response to the fifth voltage V5 is larger than the absolute value of the drain current assumed in response to the sixth voltage V6. That is to say, the resistance between the drain and the source decreases. A second non-hysteresis curve 41, in which the graphical curve drawn in consequence of increasing the electric potential difference from the fifth voltage V5 to the sixth voltage V6 and the graphical curve drawn in consequence of decreasing it from the sixth voltage V6 to the fifth voltage V5 coincide, or a third hysteresis curve 42, in which they approximate or fail to coincide, is drawn. When the voltage of the difference in electric potential between the gate conductor and the n-type substrate region falls between a seventh voltage V7 and a eighth voltage V8, a fourth hysteresis curve 43, in which the graphical curve drawn in consequence of increasing the voltage of the difference in electric potential between the gate conductor and the n-type substrate region from the seventh voltage V7 to the eighth voltage V8 and the graphical curve drawn in consequence of decreasing it from the eighth voltage V8 to the seventh voltage V7 fail to coincide, is drawn.

The semiconductor integrated circuit of this invention contains either or both of n-channel field-effect transistors and p-channel field-effect transistors possessing these special properties. When it contains the n-channel field-effect transistors, it utilizes both of the special properties of the first non-hysteresis curve 21 or first hysteresis curve 22 and the second hysteresis curve 23. When it contains the p-channel field-effect transistors, it utilizes both of the special properties of the second non-hysteresis curve 41 or third hysteresis curve 42 and the fourth hysteresis curve 43.

By imparting a varying potential difference between the gate conductor and the substrate region of the n-channel or p-channel field-effect transistor possessing a gate insulating structure containing a memory holding layer and controlling the potential differential voltage value and the fluctuation amplitude, it is made possible to electrically select a strong memory state capable of clearly discriminating whether the field-effect transistor immediately before the potential difference voltage between the gate conductor and the substrate region is varied has been in an ON or OFF state even after the potential difference voltage is set at a properly small fixed voltage and a weak memory state incapable of clearly discriminating whether the field-effect transistor immediately before the potential difference voltage between the gate conductor and the substrate region is varied has been in an ON or OFF state after the potential difference voltage is set at a properly small voltage. This weak memory state embraces a non-memory state that is the extreme condition thereof.

The n-channel or p-channel field-effect transistors possibly include an insulating layer that is capable of capturing and retaining a trap charge in the gate insulating structure 11 or 31 or in the interface. Also, the gate insulating structure possibly includes a conductor layer that is capable of capturing and retaining a charge. In the case of the gate insulating structure that acquires a memory holding function in consequence of capturing a charge injected from the exterior thereof as in these embodiments, of the second and fourth hysteresis curves that are drawn by the application of a potential difference voltage between the gate conductor and the substrate region having an amplitude so large as to enable holding a memory, the second hysteresis curve 23, for example, assumes a counterclockwise rotation when electrons are injected and discharged from the gate conductor into the gate insulating structure directly below the gate electrode layer or to the interface between the gate conductor and the gate insulating structure or assumes a clockwise rotation when electrons are injected and discharged from the substrate region into the gate insulating structure or to the interface between the gate insulating structure and the substrate. Thus, the direction of rotation is not always uniform because it depends on the positive or negative charge and the direction of the charge injected. Since the injection of charge into the gate insulating structure varies the threshold voltages of the n-channel and p-channel field-effect transistors, the first and second non-hysteresis curves 11 and 41 or the first and third hysteresis curves 22 and 42 that do not utilize a memory holding function possibly have part of their curves shared with the second and fourth hysteresis curves 23 and 43 or fail to overlap at all. FIGS. 5(*a*), 5(*b*), 7(*a*) and 7(*b*) depict examples of the graphic curves wherein the first and second non-hysteresis curves or the first and third hysteresis curves do not overlap the second and fourth hysteresis curves at all.

Figure 8:
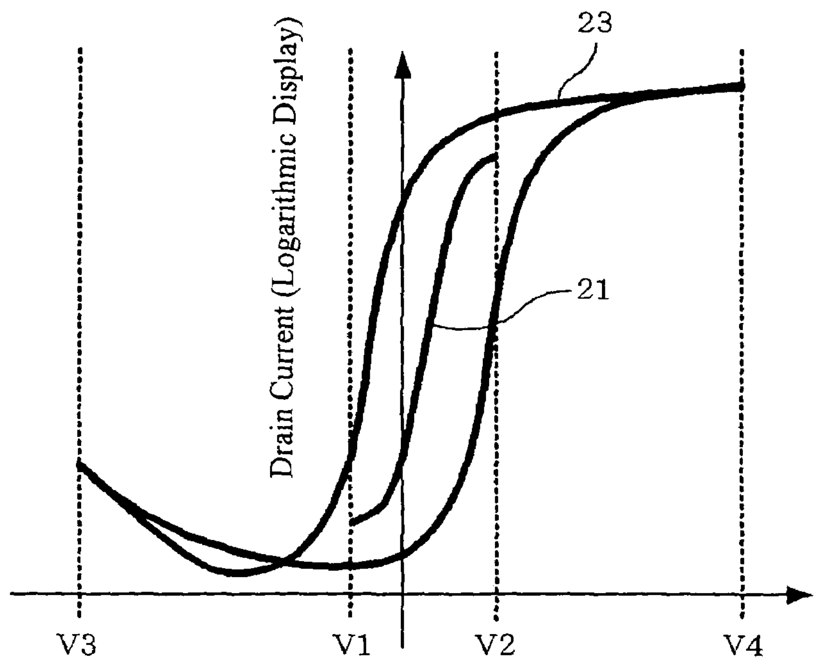
FIGS. 8(*a*) and 8(*b*) They are schematic views (Part 2) of electric characteristics of an n-channel field-effect transistor used in the embodiment of this invention.
Figure 8:
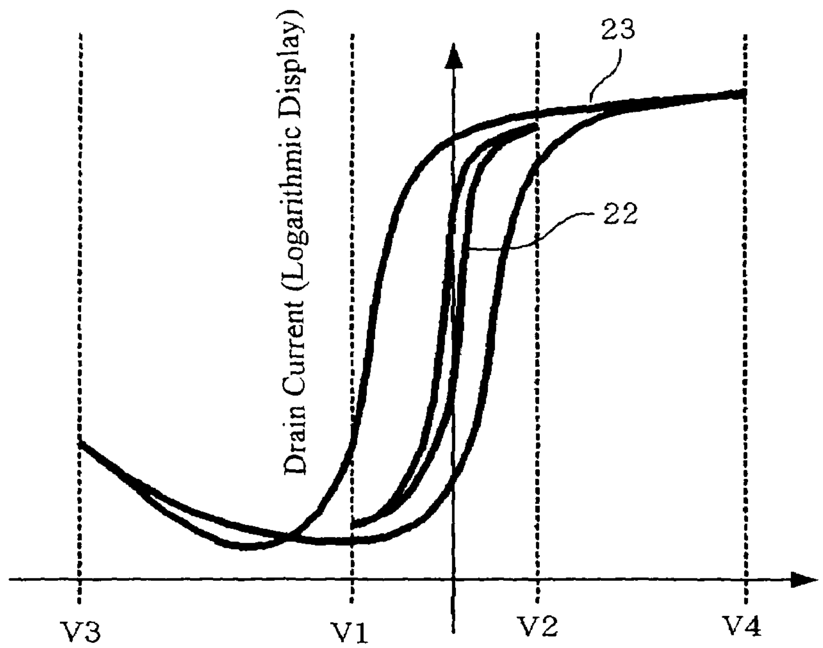

Each of examples of the graphical curves represented in FIGS. 8(*a*) and 8(*b*) shows the electric characteristic of an n-channel field-effect transistor that is one embodiment of the semiconductor integrated circuit provided by this invention. In these figures, the axis of ordinate stands for the absolute value of the drain current and the axis of abscissas stands for the voltage of the difference in electric potential between the gate conductor and the p-type substrate region. In the electric characteristic, the first non-hysteresis curve 21 or a curve situated below the first hysteresis curve 22 is drawn between the first voltage V1 and the second voltage V2 when the potential difference voltage between the gate conductor and the p-type substrate region is increased from the third voltage V3 equal to or smaller than the first voltage V1 to the fourth voltage V4 equal to or larger than the second voltage V2, the first non-hysteresis curve or a curve situated above the first hysteresis curve is drawn between the first voltage V1 and the second voltage V2 when the potential difference voltage between the gate conductor and p-type substrate region is decreased from the fourth voltage V4 to the third voltage V3, and the second hysteresis curve 23 is drawn between the third voltage V3 and the fourth voltage V4. Also, each of examples of the graphical curves represented in FIGS. 9(*a*) and 9(*b*) shows the electric characteristic of a p-channel field-effect transistor. In these figures, the axis of ordinate stands for the absolute value of the drain current and the axis of abscissas stands for the voltage of the difference in electric potential between the gate conductor and the n-type substrate region. In the electric characteristic, the second non-hysteresis curve 41 or a curve situated below the third hysteresis curve 42 is drawn between the fifth voltage V5 and the sixth voltage V6 when the potential difference voltage between the gate conductor and the n-type substrate region is increased from the seventh voltage V7 equal to or smaller than the fifth voltage V5 to the eighth voltage V8 equal to or larger than the sixth voltage V6, the second non-hysteresis curve 41 or a curve situated above the third hysteresis curve 42 is drawn between the fifth voltage V5 and the sixth voltage V6 when the potential difference voltage between the gate conductor and the n-type substrate region is decreased from the eighth voltage V8 to the seventh voltage V7, and the fourth hysteresis curve 43 is drawn between the seventh voltage V7 and the eighth voltage V8.

By imparting a varying potential difference between the gate conductor and the substrate region of the n-channel or p-channel field-effect transistor possessing a gate insulating structure containing a memory holding layer and controlling the potential differential voltage value and the fluctuation amplitude, it is made possible to electrically select a strong memory state capable of clearly discriminating whether the field-effect transistor immediately before the potential difference voltage between the gate conductor and the substrate region is varied has been in an ON or OFF state even after the potential difference voltage is set at a properly small fixed voltage and a weak memory state incapable of clearly discriminating whether the field-effect transistor immediately before the potential difference voltage between the gate conductor and the substrate region is varied has been in an ON or OFF state after the potential difference voltage is set at a properly small voltage. This weak memory state embraces a non-memory state that is the extreme condition thereof.

Figure 9:
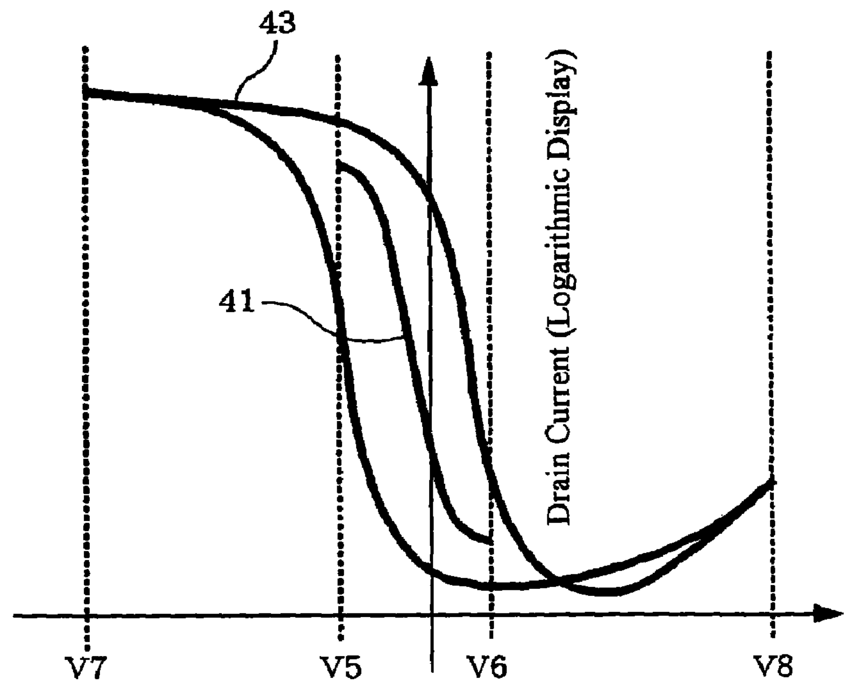
FIGS. 9(*a*) and 9(*b*) They are schematic views (Part 2) of electric characteristics of a p-channel field-effect transistor used in the embodiment of this invention.
Figure 9:
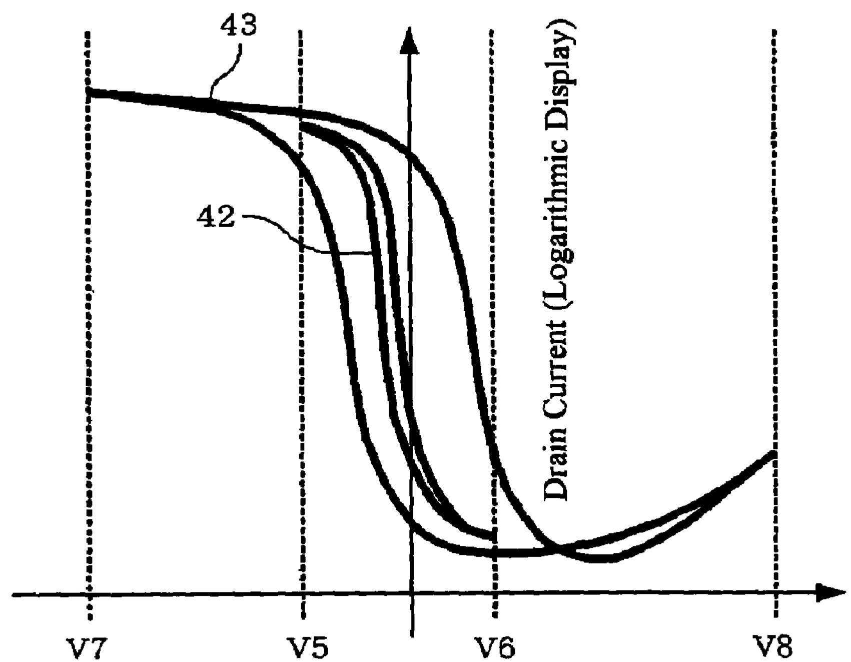

Particularly when a complementary logic circuit is constructed using n-channel field-effect transistors and p-channel field-effect transistors under the condition that the first non-hysteresis curve 21 or first hysteresis curve 22 that imparts a weak memory state to the n-channel field-effect transistors is contained in the second hysteresis curve 23 that imparts a strong memory state as illustrated in FIGS. 8(*a*) and 8(*b*) and that the second non-hysteresis curve 41 or third hysteresis curve 42 that imparts a weak memory state to the p-channel field-effect transistors is contained in the fourth hysteresis curve 43 that imparts a strong memory state as illustrated in FIGS. 9(*a*) and 9(*b*), it is made possible to set the magnitude of the input voltage fated to serve as the threshold for switching "1" and "0" of the output of any one stage of circuits assuming a complementary circuit structure in the complementary logic circuit equally for the strong memory state and for the weak memory state and also possible to facilitate the design of the complementary logic circuit.

The n-channel or p-channel field-effect transistor is possibly provided in a gate insulating structure with a ferroelectric substance. Besides the structure having a single layer of ferroelectric substance, there are cases where the structure possibly has a multilayer consisting of an insulating layer and a ferroelectric layer stacked on the insulator thereof or consisting of an insulating layer, a conductor layer and a ferroelectric layer.

When the gate insulating structure is enabled to acquire a memory holding function owing to the ferroelectricity possessing a dielectric polarization, the direction of rotation of the second and fourth hysteresis curves drawn by the application of a potential difference voltage between the gate conductor and the substrate region having an amplitude large enough to enable memory holding is counterclockwise in the second hysteresis curve and clockwise in the fourth hysteresis curve.

Also, when the gate insulating structure is enabled to acquire a memory holding function owing to the ferroelectricity possessing a dielectric polarization, the first and second non-hysteresis curves or the first and third hysteresis curves not utilizing the memory holding function possibly have part of their curves shared with the second and fourth hysteresis curves. In the case of the n-channel field-effect transistors, the potential difference voltage between the gate conductor and the p-type substrate region is possibly positioned inside the second hysteresis curve 23 as illustrated in FIGS. 8(*a*) and 8(*b*) depicting the examples thereof, particularly between the first voltage V1 and the second voltage V2. In the case of the p-channel field-effect transistors, the potential difference voltage between the gate conductor and the n-type substrate region is possibly positioned inside the fourth hysteresis curve 43 as illustrated in FIGS. 9(*a*) and 9(*b*) depicting the examples thereof, particularly between the fifth voltage V5 and the sixth voltage V6.

Now, the n-channel field-effect transistors to be used in the embodiment of this invention will be described below by citing, for example, the method of operation for applying them both for use in logical operation and for use in memory holding and for electrically switching a logical operation state, a memory write state and a nonvolatile memory holding state. Specifically, in the operation time zone, the resistance between the drain and the source assumes a high resistance state or a low resistance state in accordance as the potential difference voltage between the gate conductor and the p-type substrate region properly assumes with time a low voltage state or a high voltage state between the first voltage V1 and the second voltage V2. The n-channel field-effect transistors are regarded as assuming an OFF state in the case of the high resistance state, the n-channel field-effect transistors is in an ON state in the case of the low resistance state, and the height of the drain potential is decided depending on the height of the source potential. In the case of the memory read operation, the potential difference voltage between the gate conductor and the p-type substrate region is further changed from the second voltage V2 to the fourth voltage V4 when the potential difference voltage between the gate conductor and the p-type substrate region is the second voltage V2 immediately before the start of the memory write operation and the potential difference voltage between the gate conductor and the p-type substrate region is further changed from the first voltage V1 to the third voltage V3 when the potential difference voltage between the gate conductor and the p-type substrate region is the first voltage V1 immediately before the start of the memory write operation. Subsequently, the potential difference voltage between the gate conductor and the p-type substrate region is set at a ninth voltage V9 (refer to FIG. 15) that is a proper fixed voltage value between the third voltage V3 and the fourth voltage V4 and as well the source potential is set or opened at zero or a value near 0. In the memory holding time zone, the height of the resistance state between the drain and the source immediately before the memory write operation is digitally memorized as a binary value by keeping the potential difference voltage between the gate conductor and the p-type substrate region at the ninth voltage V9 and keeping the source potential at zero or a value near zero, or open. At the time of restarting the operation, by returning the source potential to the value during the operation time zone immediately before the start of the memory write operation, it is made possible to reproduce the height of the drain potential conforming to the height of the source potential restored at the time of restarting the operation when the resistance between the drain and the source memorized during the memory holding time zone is low, i.e. when the ON state is memorized in the n-channel field-effect transistor and allow continuation of the OFF state of the n-channel field-effect transistor when the resistance between the drain and the source memorized during the memory holding time zone is low, i.e. when the OFF state is memorized in the n-channel field-effect transistor. Consequently, the drain potential immediately before the memory write operation is reproduced no matter whether the n-channel field-effect transistor is in the ON or OFF state, and the drain potential imparts the potential difference voltage between the gate conductor and the substrate region to any of the transistors at the next stage to restart the operation as the initial-state operation.

Now, the p-channel field-effect transistor to be used in the embodiment of this invention will be described below by citing an example of the method of operation for applying it both to the use for logical operation and to the use for memory holding and enabling electrical switching among the logical operation state, memory write state and nonvolatile memory holding state. To be specific, in the operation time zone, the resistance between the drain and the source assumes a low or high resistance state in accordance as the potential difference voltage between the gate conductor and the n-type substrate region in the p-channel field-effect transistor assumes with time a proper low or high voltage state between the fifth voltage V5 and the sixth voltage V6. In the case of the low resistance state, the p-channel field-effect transistor assumes the ON state and decides the height of the drain potential in accordance with the height of the source potential. In the case of the high resistance state, the p-channel field-effect transistor is regarded as assuming the OFF state. During the memory write operation, the potential difference voltage between the gate conductor and the n-type substrate region is further changed from the fifth voltage V5 to the seventh voltage V7 when the potential difference voltage between the gate conductor and the n-type substrate region is the fifth voltage V5 immediately before the start of the memory write operation. When the potential difference voltage between the gate conductor and the n-type substrate region is the sixth voltage V6 immediately before the start of the memory write operation, the potential difference voltage between the gate conductor and the n-type substrate region is further changed from the sixth voltage V6 to the eighth voltage V8 to carry out the memory write operation and then set the potential difference voltage between the gate conductor and the p-type substrate region at a tenth voltage V10 (refer to FIG. 17) that is a properly fixed voltage value between the seventh voltage V7 and the eighth voltage V8 and as well keep the source potential at zero or a position near zero, or open. During the memory holding time zone, the height of the resistance state between the drain and the source immediately before the memory write operation is digitally memorized in a binary value by keeping the potential difference voltage between the gate conductor and the n-type substrate region at the tenth voltage and keeping the source potential at zero or a value near zero, or open. At the time of restarting the operation, by returning the source potential to a value in the operation time zone immediately before the start of the memory write operation, it is made possible to reproduce the height of the drain potential in conformity with the height of the source potential restored at the time of restarting the operation when the resistance between the drain and the source memorized during the memory holding time zone is low, i.e. when the ON state is memorized in the p-channel field-effect transistor. When the resistance between the drain and the source memorized during the memory holding time zone is high, i.e. when the OFF state is memorized in the p-channel field-effect transistor, the OFF state of the p-channel field-effect transistor is continued and the drain potential immediately before the memory write operation is reproduced no matter whether the p-channel field-effect transistor is in the ON or OFF state. The drain potential imparts the potential difference voltage between the gate conductor and the substrate region to any of the transistors at the next stage to restart the operation as the initial-state operation.

By using this method of operation, it is made possible to utilize the same field-effect transistor without discrimination between field-effect transistors for use in logical operation and for use in memory holding and allow optional electrical switching among the logical operation state, memory write operation state and nonvolatile memory holding state of the same field-effect transistor. The problems that have been encountered heretofore because of sorting out the production processes for the field-effect transistors to be used for logical operation and the field-effect transistors to be used for memory holding can be suppressed, which problems include the increase in the number of steps of production, the fear of the decline of the yield due to the contamination by dispersion of materials, the increase of the layout area for the sake of securing the configuration space on the semiconductor substrate between the different kinds of field-effect transistors and the increase of the layout area due to the laying out of wires between the memory circuits and the logic circuit.

Figure 10:
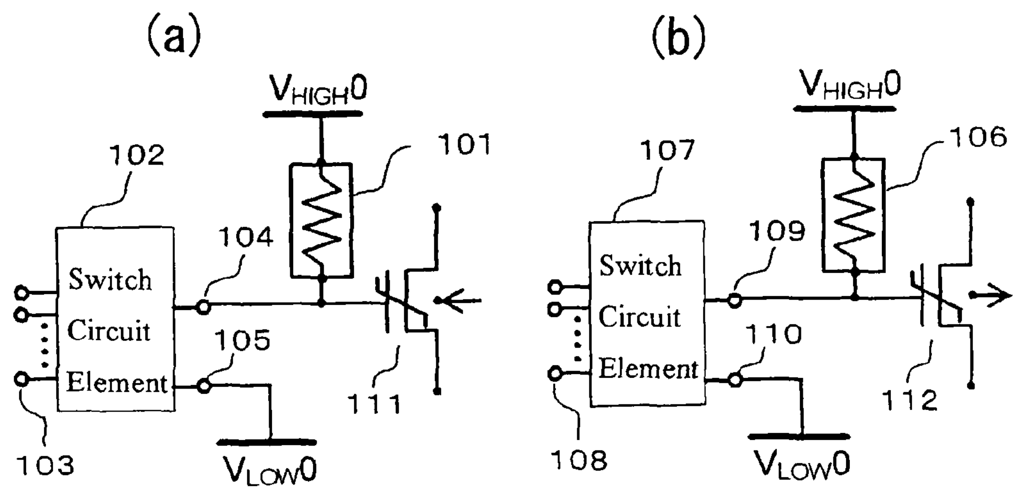
FIGS. 10(*a*) and 10(*b*) They are circuit diagrams (Part 1) illustrating examples of connecting circuits to the gate terminals of an n-channel field-effect transistor and a p-channel field-effect transistor used in the embodiment of this invention.

Now, one example of the circuit configuration to be used in the embodiment of this invention for arbitrarily changing the potential difference voltage between the gate conductor and the p-type substrate region of the n-channel field-effect transistor and the potential difference voltage between the gate conductor and the n-type substrate region of the p-channel field-effect transistor will be described below. The circuit to be used in this invention, as illustrated in FIGS. 10(*a*) and 10(*b*), possesses at least one of switch circuits elements 102 and 107 capable of selecting conduction state and non-conduction state of input terminals 105 and 110 and output terminals 104 and 109 and at least one of two-terminal resistance elements 101 and 106, depending on the conditions of controlling terminals 103 and 108. These resistance elements refer to resistors in the broad sense of word, including not only the resistors producing current of linear response to an applied voltage but also resistors producing current of nonlinear response to an applied voltage such as, for example, resistors between the source region and the drain region of ordinary field-effect transistors.

To include the n-channel field-effect transistor, as illustrated in FIG. 1(*a*), one of the terminals of the resistance element 101 and the output terminal 104 of the switch circuit element 102 are connected to the gate terminal of the n-channel field-effect transistor 111 to allow optional selection of the high voltage state and the low voltage state of the potential difference voltage between the gate conductor and the p-type substrate region during the operating time in conformity with the condition of the high power source voltage $V_{HIGH}$ 0 of the other terminal of the resistance element 101, the condition of the controlling terminal 103 of the switch circuit element 102 and the condition of the low power source voltage $V_{LOW}$ 0 of the input terminal 105 of the switch circuit.

During the memory write operation, when the potential difference voltage between the gate conductor and the p-type substrate region of the n-channel field-effect transistor 111 is in the high voltage state, it (the voltage of the high power source voltage $V_{HIGH}$ 0) is further raised. When the potential difference voltage between the gate conductor and the n-type substrate region is in the low voltage state, it (the voltage of the low power source voltage $V_{LOW}$ 0) is further lowered.

When a p-channel field-effect transistor is included, as shown in FIG. 10(B), one of the terminals of the resistance element 106 and the output terminal 109 of the switch circuit element 107 are connected to the gate terminal of the p-channel field-effect transistor 112 so as to enable optional choice the high voltage state and the low voltage state of the potential difference voltage between the gate conductor and the n-type substrate region of the p-channel field-effect transistor in the operating time zone in conformity with the condition of the high power source voltage $V_{HIGH}$ 0 of the other terminal of the resistance element 106, the condition of the controlling terminal 108 of the switch circuit element 107 and the condition of the low power source voltage $V_{LOW}$ 0 of the input terminal of the switch circuit. During the memory write operation, when the potential difference voltage between the gate conductor and the n-type substrate region of the p-channel field-effect transistor is in the high voltage state, it (the voltage of the high power source voltage $V_{HIGH}$ 0) is further raised. When the potential difference voltage between the gate conductor and the n-type substrate region is in the low voltage state, it (the voltage of the low power source voltage $V_{LOW}$ 0) is further lowered.

Another example of the circuit to be used in the embodiment of this invention for arbitrarily changing the potential difference voltage between the gate conductor and the p-type substrate region of the n-channel field-effect transistor and the potential difference voltage between the gate conductor and the n-type substrate of the p-channel field-effect transistor will be described below. The circuit to be used in this invention, as illustrated in FIG. 11 depicting one example, possesses at least two switch circuit elements 113 and 116 (or 117 and 120) such that one of the switch circuit elements is in a non-conduction state when the other is in a conduction state.

Figure 11:
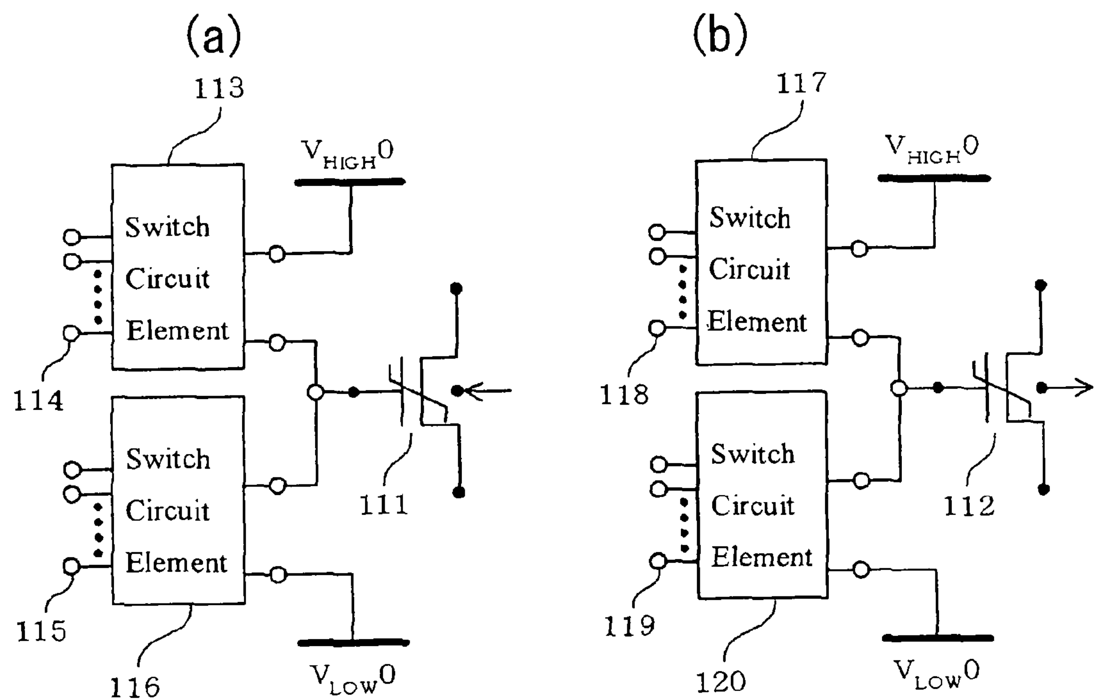
FIGS. 11(*a*) and 11(*b*) They are circuit diagrams (Part 2) illustrating examples of connecting circuits to the gate terminals of an n-channel field-effect transistor and a p-channel field-effect transistor used in the embodiment of this invention.

In the case of including the n-channel field-effect transistor, the output terminals of the two switch circuit elements 113 and 116 are connected to the gate terminal of the n-channel field-effect transistor 111 as illustrated in FIG. 11(*a*) and the high voltage state and the low voltage state of the potential difference voltage between the gate conductor and the p-type substrate region of the n-channel field-effect transistor are arbitrarily selected in accordance with the condition of the controlling terminals 114 and 115 of the two switch circuit elements 113 and 116 and the power source voltages $V_{HIGH}$ 0 and $V_{LOW}$ 0 during the operation time zone.

During the memory write operation, when the potential difference voltage between the gate conductor and the p-type substrate region of the n-channel field-effect transistor 111 is in the high voltage state, it (the voltage of the high power source voltage $V_{HIGH}$ 0) is further raised or when the potential difference voltage between the gate conductor and the p-type substrate region is in the low voltage state, it (the voltage of the low power source voltage $V_{LOW}$ 0) is further lowered.

In the case of including the p-channel field-effect transistor, the output terminals of the two switch circuit elements 117 and 120 are connected to the gate terminal of the p-channel field-effect transistor 112 as illustrated in FIG. 11(*b*) to allow optional selection between the high voltage state and the low voltage state of the potential difference voltage between the gate conductor and the n-type substrate region of the p-channel field-effect transistor 112 in accordance with the conditions of the controlling terminals of the two switch circuit elements 117 and 120 and the potential of the input terminal during the operation time zone.

At the time of the memory write operation, when the potential difference voltage between the gate conductor and the n-type substrate region of the p-channel field-effect transistor 112 is in the high voltage state, it (the voltage of the high power source voltage $V_{HIGH}$ 0) is further raised or when the potential difference voltage between the gate conductor and the n-type substrate is in the low voltage state, it (the voltage of the low power source voltage $V_{LOW}$ 0) is further lowered.

By connecting the outputs of the switch circuit elements as the outputs of the circuits of the former stages to the gate terminal of the circuit in the main stage as described above, it is made possible to arbitrarily change the potential difference voltage electrically between the gate conductor and the substrate region of the circuit of the main stage tending to electrically change the logical operation state, memory write state and nonvolatile memory holding state, i.e. the potential difference voltage between the gate conductor and the p-type substrate region of the n-channel field-effect transistor 111 and the potential difference voltage between the gate conductor and the n-type substrate of the p-channel field-effect transistor 112.

One or more of the switch circuit elements are possibly configured so as to include the n-channel field-effect transistor or the p-channel field-effect transistor. The n-channel or p-channel field-effect transistors included in the switch elements may be of the type capable of arbitrarily switching the logical operation state, memory write state and nonvolatile memory holding state electrically like the circuit of the main stage or of the conventional type possessing no nonvolatile memory function unlike the circuit of the main stage. In the former case, the field-effect transistor possessing a same gate insulating structure may be used both as the field-effect transistor tending to electrically switch the logic operation state, memory write state and nonvolatile memory holding state and as the field-effect transistor forming a circuit for varying the potential difference voltage between the gate conductor and the substrate region. That is, the field-effect transistors possessing the same gate insulating structure may be used for all the field-effect transistors that form the circuit.

Figure 12:
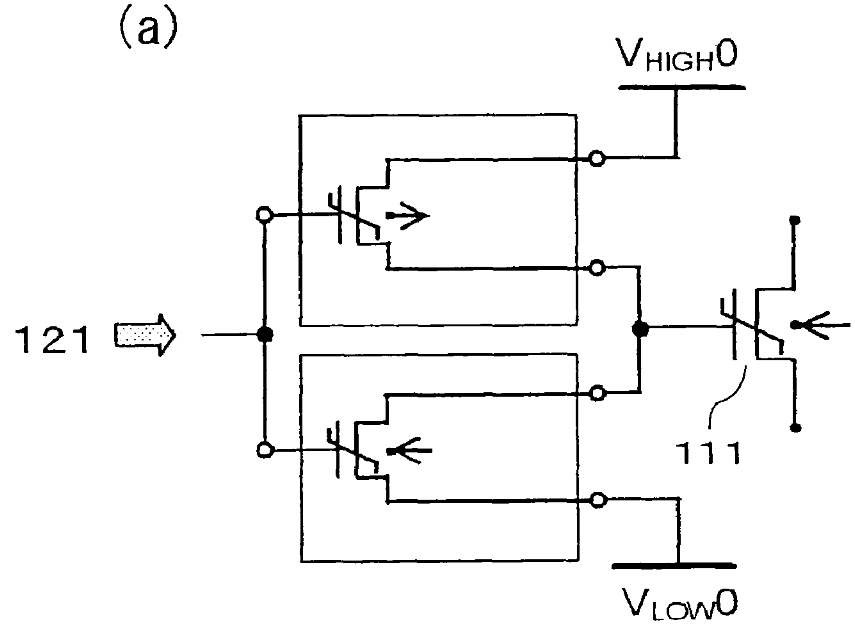
FIGS. 12(*a*) and 12(*b*) They are circuit diagrams (Part 3) illustrating examples of connecting circuits to the gate terminals of an n-channel field-effect transistor and a p-channel field-effect transistor used in the embodiment of this invention.
Figure 12:
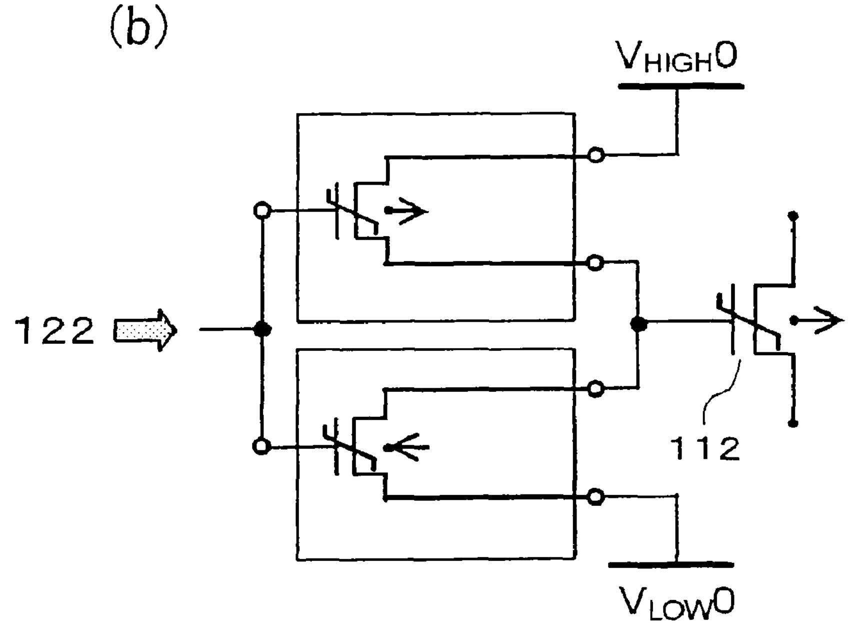

In one example illustrated in FIGS. 12(*a*) and 12(*b*), one of switch circuit elements is formed of an n-channel field-effect transistors provided in a sole gate insulating structure with memory holding layers and the other switch circuit element is formed of a sole p-channel field-effect transistor. Since the gate terminals of the respective sole field-effect transistors (the control terminals of the switch circuit elements) are mutually connected, one of the switch circuit elements is in the non-conduction state when the other switch circuit element is in the conduction state.

One embodiment of the semiconductor integrated circuit of this invention includes either or both of the field-effect transistors, i.e. the n-channel field-effect transistor and the p-channel field-effect transistor, that are capable of electrically switching the logical operation state, memory write state and nonvolatile memory holding state. When the n-channel field-effect transistor is included, the special properties of both the first non-hysteresis curve or the first hysteresis curve and the second hysteresis curve are utilized. When the p-channel field-effect transistor is included, the special properties of both the second non-hysteresis curve or the third hysteresis curve and the fourth hysteresis curve are utilized.

In the circuit to be used in this invention, at least one n-channel field-effect transistor utilizes the special properties of both the first non-hysteresis curve or the first hysteresis curve and the second hysteresis curve and at least one p-channel field-effect transistor possibly utilizes the special properties of both the second non-hysteresis curve or the third hysteresis curve and the fourth hysteresis curve.

When two or more n-channel field-effect transistors are included, at least one of these n-channel field-effect transistors utilizes the characteristic of the first non-hysteresis curve or the first hysteresis curve and at least another of these field-effect transistors utilizes the characteristic of the second hysteresis curve.

Similarly, one embodiment of the semiconductor integrated circuit of this invention includes two or more p-channel field-effect transistors. At least one of the p-channel field-effect transistors utilizes the characteristic of the second non-hysteresis curve or the third hysteresis curve and at least another of the field-effect transistors utilizes the characteristic of the fourth hysteresis curve.

One embodiment of the semiconductor integrated circuit of this invention includes both the n-channel field-effect transistors and the p-channel field-effect transistors. At least one of the n-channel field-effect transistors utilizes the characteristic of the first non-hysteresis curve or the first hysteresis curve and at least one of the p-channel field-effect transistors utilizes the characteristic of the fourth hysteresis curve.

Similarly, one embodiment of the semiconductor integrated circuit of this invention includes both the n-channel field-effect transistors and the p-channel field-effect transistors. At least one of the n-channel field-effect transistors utilizes the characteristic of the second hysteresis curve and at least one of the p-channel field-effect transistors utilizes the characteristic of the second non-hysteresis curve or the third hysteresis curve.

Then, one embodiment of the semiconductor circuit of this invention includes the n-channel field-effect transistors or the p-channel field-effect transistors.

In the case of including the n-channel field-effect transistors, at least one of the n-channel field-effect transistors utilizes the characteristic of the first non-hysteresis curve or the first hysteresis curve alone while varying the potential difference voltage between the gate conductor and the p-type substrate region of the field-effect transistor only in the range of the first voltage V1 and the second voltage V2. In the case of including the p-channel field-effect transistors, at least one of the p-channel field-effect transistors utilizes the characteristic of the second non-hysteresis curve or the third hysteresis curve alone while varying the potential difference voltage between the gate conductor and the n-type substrate region of the field-effect transistor only in the range of the fifth voltage V5 and the sixth voltage V6.

One embodiment of the semiconductor integrated circuit of this invention includes the n-channel field-effect transistors or the p-channel field-effect transistors.

In the case of including the n-channel field-effect transistors, at least one of the n-channel field-effect transistors utilizes the characteristic of only the second hysteresis curve while varying the potential differential voltage between the gate conductor and the p-type substrate region of the field-effect transistor only in the range of the third voltage V3 and the fourth voltage V4. When the p-channel field-effect transistors are included, at least one of the p-channel field-effect transistors utilizes the characteristic of the fourth hysteresis curve alone while varying the potential difference voltage between the gate conductor and the n-type substrate region of the field-effect transistor only in the range of the seventh voltage V7 and the eighth voltage V8.

This invention, as described above, enables all the field-effect transistors forming a given circuit, irrespectively of the discrimination between the memory circuit and the logic circuit, to be formed of n- and p-channel field-effect transistors provided in a gate insulating structure with a memory holding material and enables electrically switching the logic operation state, memory write state and nonvolatile memory holding state by controlling the magnitude of the voltage applied between the gates and the substrate regions of the relevant field-effect transistors and the timing of the application of the voltage.

As a result, the processes of production heretofore separately prepared for the field-effect transistors for use in memory holding and the field-effect transistors for use in logical operation do no longer need to be separated. To be specific, when the p-channel field-effect transistor is required to fulfill only the logical operation function, it suffices causing the potential difference voltage between the gate conductor and the p-type substrate region to be varied only in the range of the first voltage V1 and the second voltage V2. When the p-channel field-effect transistor is required to fulfill only the logical operation function, it suffices causing the potential difference voltage between the gate conductor and the n-type substrate region to be varied only in the range of the fifth voltage V5 and the sixth voltage V6. When the n-channel field-effect transistor is required to fulfill only the nonvolatile memory write and holding functions, it suffices causing the potential difference voltage between the gate conductor and the p-type substrate region to be varied only in the range of the third voltage V3 and the fourth voltage V4 during the nonvolatile memory write and to be retained at the ninth voltage V9 that is a fixed voltage between the third voltage V3 and the fourth voltage V4 during the nonvolatile memory holding. When the p-channel field-effect transistor is required to fulfill the nonvolatile memory write and holding functions, it suffices causing the potential difference voltage between the gate conductor and the n-type substrate region to be varied only in the range of the seventh voltage V7 and the eighth voltage V8 during the nonvolatile memory write and to be retained at the tenth voltage V10 that is a fixed voltage between the seventh voltage V7 and the eighth voltage V8 during the nonvolatile memory holding.

When the n-channel field-effect transistor is used both for the purposes of logical operation and nonvolatile memory write and holding, it suffices causing the potential difference voltage between the gate conductor and the p-type substrate region to be arbitrarily selectively varied in the two ranges, i.e. from the first voltage V1 to the second voltage V2 and from the third voltage V3 to the fourth voltage V4, and the ninth voltage V9 as the fixed voltage. Similarly when the p-channel field-effect transistor is used both for the purposes of logical operation and nonvolatile memory write and holding, it suffices causing the potential difference voltage between the gate conductor and the n-type substrate region to be arbitrarily selectively varied in the two ranges, i.e. from the fifth voltage V5 to the sixth voltage V6 and from the seventh voltage V7 to the eighth voltage V8, and the tenth voltage V10 as the fixed voltage. Here, the range of the potential difference voltage between the gate conductor and the substrate region necessary for the logical operation can be smaller than the range of the voltage necessary for the nonvolatile memory write. The range of the potential difference voltage between the gate conductor and the substrate region necessary for the nonvolatile memory write is fixed by the memory holding ability of the gate insulating structure material of the field-effect transistor, namely the amount of the polarization charge held or captured per unit applied field and the thicknesses of the individual layers of the gate insulating structure.

The amplitude of voltage of the hysteresis curve decreases and the speed of the logical operation is increased in accordance as the range of the potential difference voltage between the gate conductor and the substrate region necessary for the logical operation decreases. The extremity of the decrease in amplitude of the voltage of the hysteresis curve may be regarded as the non-hysteresis curve. The smallest allowable value of the potential difference voltage between the gate conductor and the substrate region necessary for the logical operation is the value at which the ON and OFF states of the field-effect transistor can be discriminated.

One embodiment of the semiconductor integrated circuit of this invention is provided with means to generate internal power source voltage by the operation of a constant voltage generating circuit built therein or disposed outside adjacently thereto in response to an external power source potential supplied from the exterior and is allowed to utilize internal power source voltages of varying sizes necessary for the logical operation of the n-channel field-effect transistor capable of nonvolatile memory; internal power source voltages of varying sizes, besides the second voltage V2 and the first voltage V1, necessary for the nonvolatile memory write; the fourth voltage V4, third voltage V3 and internal power source voltages of varying sizes necessary for the logical operation of the p-channel field-effect transistor capable of nonvolatile memory; internal power source voltages of varying sizes, besides the sixth voltage V6 and the fifth voltage V5, necessary for the nonvolatile memory write; and the eighth voltage V8, seventh voltage V7, ninth voltage V9 that is the fixed holding voltage necessary for the nonvolatile memory holding of the n-channel field-effect transistor and tenth voltage that is the fixed holding voltage necessary for the nonvolatile memory holding of the p-channel field-effect transistor. The ninth voltage V9 or tenth voltage is possibly equal to a zero potential.

As already described above, the range of the potential difference voltage between the gate conductor and the substrate region necessary for the logical operation is small as compared with the range of voltage necessary for the nonvolatile memory write. As it decreases to an extent barely allowing discrimination of the ON and OFF states of the field-effect transistor, though the speed of the logical operation is increased, many power sources numbering from one to ten are required. However, by adopting any one or all of the following conditions:

that the second voltage V2 equals the sixth voltage V6,
that the first voltage V1 equals the fifth voltage V5,
that the fourth voltage V4 equals the eighth voltage V8,
that the third voltage V3 equals the seventh voltage V7 and
that the ninth voltage V9 equals the tenth voltage V10, it is made possible to apply a voltage, which is not necessary the potential difference voltage between the gate conductor and the substrate region optimal for the high-speed operation of the n-channel field-effect transistor and the p-channel field-effect transistor, between the gate conductor and the substrate region and enabled to contribute to a decrease in necessary kinds of power source potentials, a decrease in number of transistors forming the power source potential generating circuit, a decrease in number of wires laid among the power sources and a reduction in layout area, notwithstanding the logical operation speed may possibly be retarded.

Similarly, by adopting any one of or a plurality of the following conditions:

that the first voltage V1 equals the third voltage V3,
that the second voltage V2 equals the fourth voltage V4,
that the fifth voltage V5 equals the seventh voltage V7 and
that the sixth voltage V6 equals the eighth voltage V8, it is made possible to apply a voltage amplitude, which is large enough to enable memory write even during the logical operation of the n-channel field-effect transistor and the p-channel field-effect transistor, between the gate conductor and the substrate and enabled to contribute to a decrease in necessary kinds of power source potentials, a decrease in number of transistors forming the power source potential generating circuit, a decrease in number of wires laid among the power sources and a reduction in layout area, notwithstanding the logical operation speed may possibly be retarded.

One embodiment of the semiconductor integrated circuit of this invention includes both the n-channel field-effect transistors and the p-channel field-effect transistors and further includes complementary circuit elements resulting from mutually connecting the drain terminals and mutually connecting the gate terminals of at least one of the n-channel field-effect transistors and at least one of the p-channel field-effect transistors.

One embodiment of the semiconductor integrated circuit of this invention includes both the n-channel field-effect transistors and the p-channel field-effect transistors and further includes complementary circuit elements such that at least one of the n-channel field-effect transistors utilizes the special properties of both the first non-hysteresis curve or the first hysteresis curve and the second hysteresis curve, that at least one of the p-channel field-effect transistors utilizes the special properties of both the second non-hysteresis curve or the third hysteresis curve and the fourth hysteresis curve and that when the resistance between the drain and the source of one of the n-channel field-effect transistor and the p-channel field-effect transistor is in the high-resistance state, the resistance between the drain and the source of the other field-effect transistor is in the low-resistance state either in the calculation time zone or in the memory holding time zone.

One embodiment of the semiconductor logical circuit of this invention performs the complementary logical operation of NOT, NAND or NOR, or the composite logical operation combining them. All the logical operation circuits utilizing the CMOS structure including the flip flop circuits, besides the examples of logical circuits of NOT, NAND and NOR, can be replaced with the complementary logical operation circuits possessing the nonvolatile memory function of this invention.

The substrate region potential of the n-channel field-effect transistor or the p-channel field-effect transistor constituting the complementary circuit element may be imparted independently of the potential of the source terminal. The substrate region potential can be connected to the source terminals of the individual field-effect transistors.

In the complementary circuit elements, the potential difference voltage between the gate conductor and the substrate region of the n-channel field-effect transistor or the p-channel field-effect transistor constituting the logical circuit can be controlled not only by the variation of the gate potential but also by the variation of the substrate region potential.

By constructing the complementary circuit element by the use of a field-effect transistor capable of electrically switching the logical operation state, memory write state and nonvolatile memory holding state as described above, the conventional CMOS logic circuit possessing no nonvolatile memory function and the memory circuit unfit for the logical operation can be replaced with the field-effect transistor of this invention without impairing the conventional logic function and the memory function. Further, the nonvolatile memory function is imparted to the logical circuit and the logical operation function to the memory circuit owing to the fact that the logical operation state, memory write state and nonvolatile memory holding state can be electrically switched. Furthermore, by replacing the conventional CMOS logic circuit and memory circuit with the field-effect transistor of this invention without altering the circuit structure, the assets of designs developed with a view to acquiring required functions can be effectively utilized.

One embodiment of the semiconductor integrated circuit of this invention is provided with a memory cell array that results from utilizing an n-channel field-effect transistor or a p-channel field-effect transistor as a control transistor and another n-channel field-effect transistor or another p-channel field-effect transistor as a memory transistor, preparing a circuit having the drain terminal of the control transistor connected to the gate terminal of the memory transistor as a circuit unit, and regularly arranging such circuit units lengthwise and crosswise.

Figure 13:
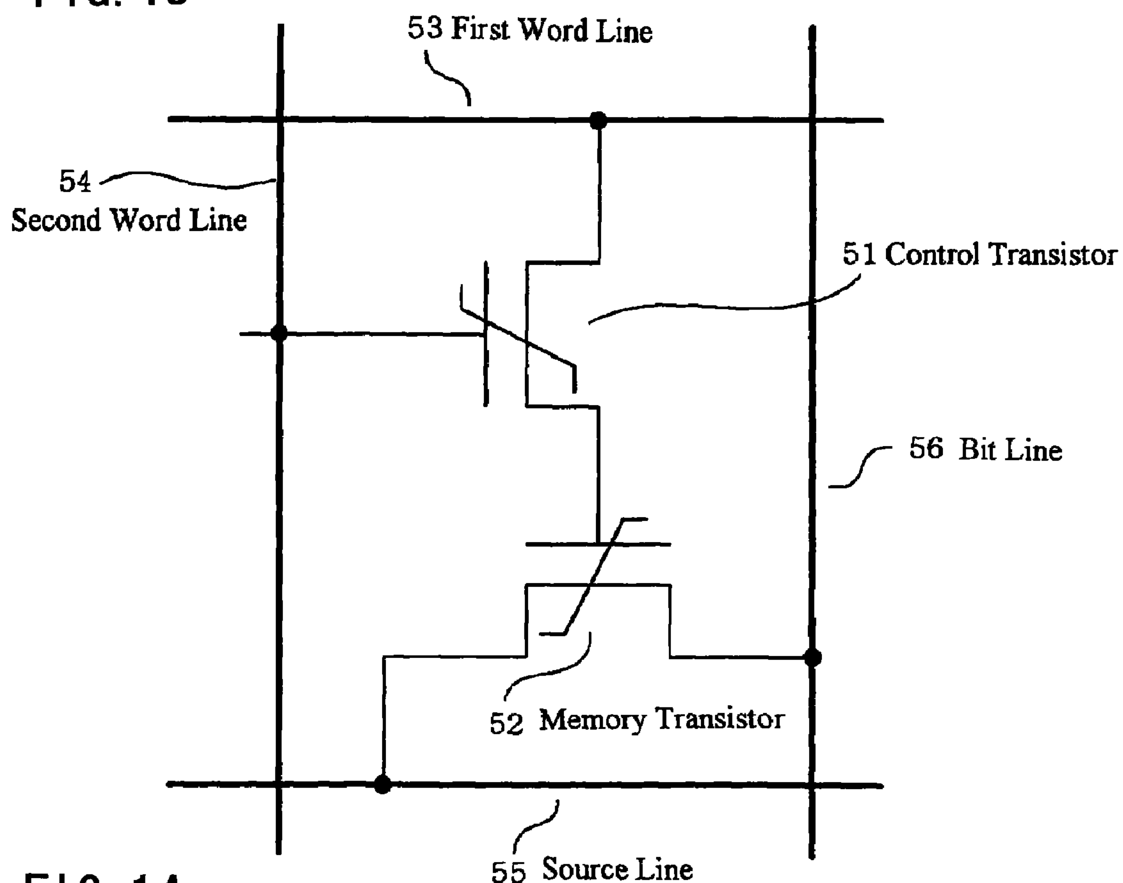
FIG. 13 It is a circuit diagram illustrating one example of a memory cell used for a memory used in the embodiment of this invention.

One example of the memory cell forming this memory cell array is illustrated in FIG. 13. A control transistor 51 formed of an n-channel field-effect transistor or a p-channel field-effect transistor has its drain connected to the gate of a memory transistor 52 formed of an n-channel field effect or a p-channel field effect. The source of the control transistor is connected to a first word line 53 and the gate thereof is connected to a second word line 54. The source of the memory transistor 52 is connected to a source line 55 and the drain thereof is connected to a bit line 56. A diode may be interconnected between the source of the memory transistor 52 and the source line 55 or between the drain and the bit line 56. In the ordinary state of use of this memory cell, the control transistor 51 utilizes only the characteristic of the first non-hysteresis curve or the first hysteresis curve (or the second non-hysteresis curve or the third hysteresis curve) and he memory transistor 52 utilizes only the characteristic of the second hysteresis curve (or the fourth hysteresis curve).

Figure 14:
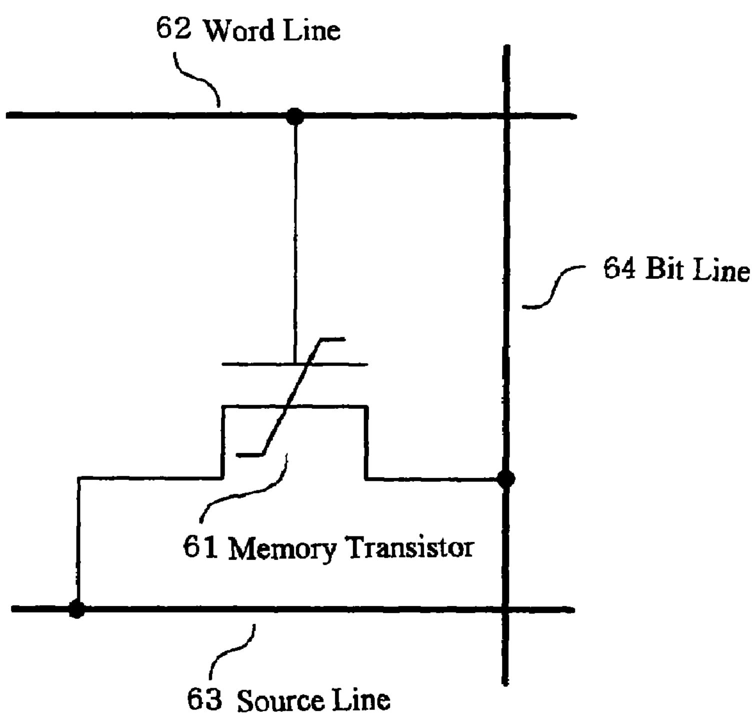
FIG. 14 It is a circuit diagram illustrating another example of a memory cell used in a memory in the embodiment of this invention.

The memory cell may be constructed without using the control transistor. One example of this case is illustrated in FIG. 14. The gate of a memory transistor 61 is connected to a word line 62, the source thereof to a source line 63, and the drain thereof to a bit line 64. A diode may be interconnected between the source of the memory transistor 61 and the source line 63 or between the drain and the bit line 64. In the ordinary form of use of this memory cell, the memory transistor 61 utilizes only the characteristic of the second hysteresis curve (or the fourth hysteresis curve) and, when the memory data in the array is collectively erased by the region unit, utilizes the characteristic of the first non-hysteresis curve or the first hysteresis curve (or the second non-hysteresis curve or the third hysteresis curve). After the collective erasure mentioned above, when the gate insulating structure contains a ferroelectric substance, the motion of the collective erasure contributes to elongation of the service life of the memory array because the reduced polarization field applied to the ferroelectric substance becomes extremely small.

By constructing the memory cell array using the field-effect transistors capable of electrically switching the logical operation state, memory write state and nonvolatile memory holding state as described above, the conventional memory cell array can be replaced with the field-effect transistor of this invention without impairing the memory function of the conventional memory cell array. An arbitrary part of the field-effect transistors in the array may be diverted to the use for logical operation or may be used positively as a logic array capable of rewriting a memory cell array.

Figure 15:
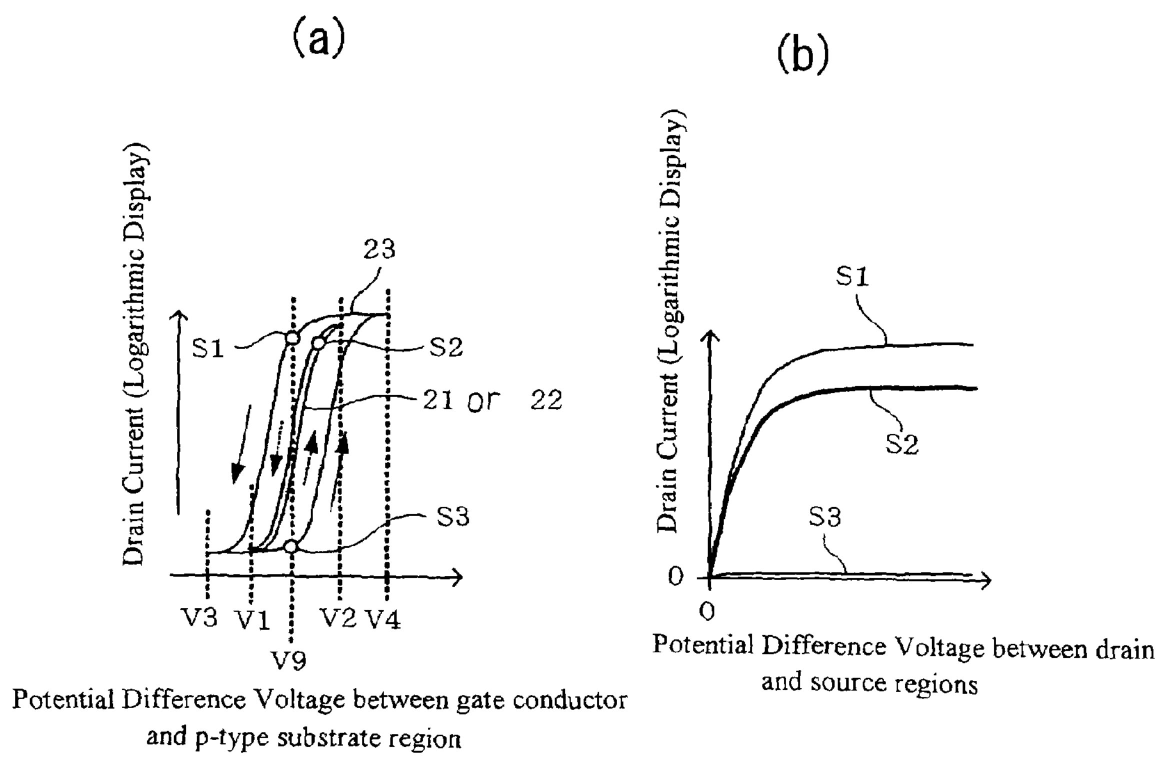
FIGS. 15(*a*) and 15(*b*) They are schematic views of electric characteristics indicating the dependency of the current between the source and drain regions on the voltage between the gate conductor and the p-type substrate region and electric characteristics indicating the dependency of the current between the source and drain regions on the voltage between the source and drain regions in an n-channel field-effect transistor used in the embodiment of this invention.

Now, the electric characteristics of the n-channel field-effect transistor used in this invention and enabled to attain electric switching of the logical operation state, memory write state and nonvolatile memory holding state will be further described below. One example of the electric characteristics representing the dependency of the current between the source and drain regions on the voltage between the gate conductor and the p-type substrate region is illustrated in FIG. 15(*a*) and one example of the electric characteristics representing the dependency of the current between the source and drain regions on the voltage between the source and drain regions in FIG. 15(*b*). The arrowed solid line in FIG. 15(*a*) shows the direction of revolution of the second hysteresis curve and the arrowed broken line shows the direction of revolution of the first hysteresis curve. The curve of S1 in FIG. 15(*b*) represents an example of the curve that corresponds to the nonvolatile ON-memory state assumed when the potential difference voltage between the gate conductor and the p-type substrate region is once changed to the fourth voltage V4 and then returned to the ninth voltage V9, and the curve of S2 in FIG. 15(*b*) represents an example of the curve that corresponds to the ON state of the logical operation in the non-memory state assumed when the potential difference voltage between the gate conductor and the p-type substrate region is changed in the range of from the first voltage V1 to the second voltage V2 and the curve of S3 represents an example of the curve that corresponds to the nonvolatile OFF-memory state assumed when the potential difference voltage between the gate conductor and the p-type substrate region is once changed to the third voltage V3 and then returned to the ninth voltage V9.

Figure 16:
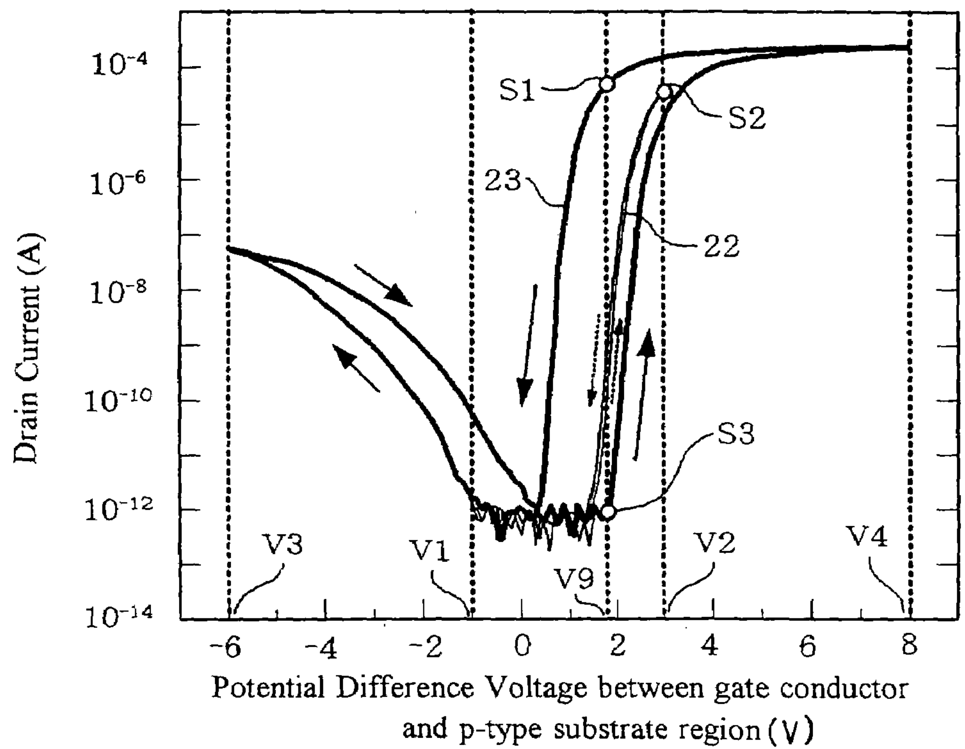
FIGS. 16(*a*) and 16(*b*) They are graphs showing the results of actual measurement of the electric characteristics corresponding to those shown in the schematic views of FIG. 15 in the case of realizing an n-channel field-effect transistor involved in the circuit of this invention by using a gate conductor of Pt and using as a gate insulating structure a two-layer structure consisting of a ferroelectric layer of $SrBi_2Ta_2O_9$ and an insulating layer of Hf-Al-O.
Figure 16:
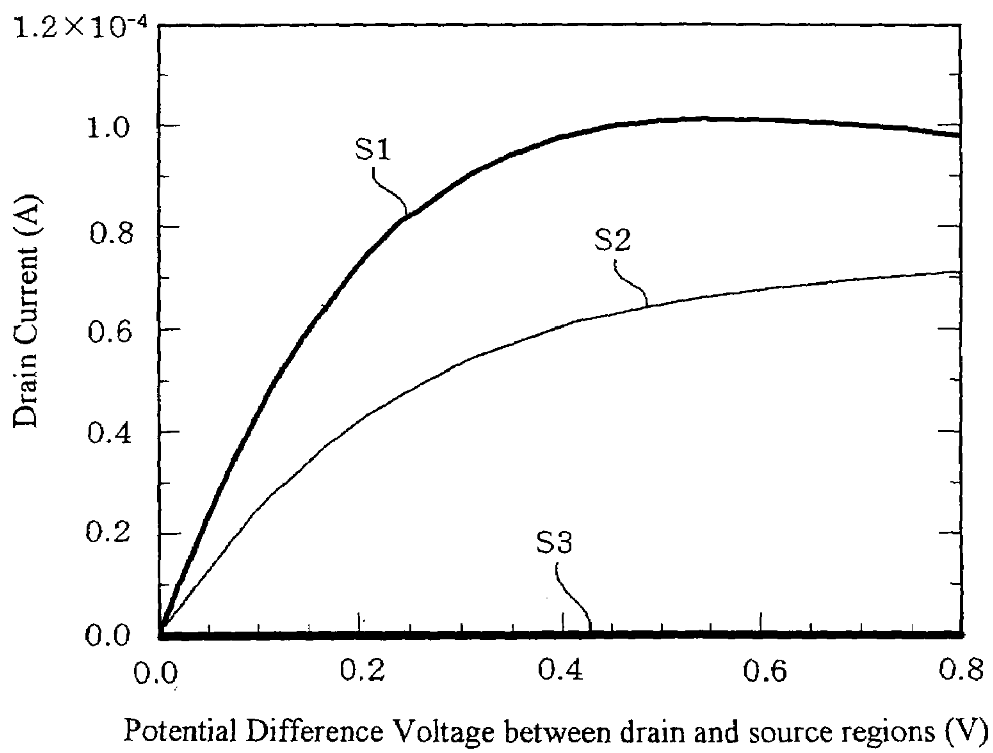

As an example, the results of an experiment performed on an n-channel field-effect transistor conforming to the characteristic of FIG. 15 and obtained by using a Pt layer having a thickness of 220 nm as a gate conductor, a two-layer structure consisting of a ferroelectric $SrBi_2Ta_2O_9$ layer (420 nm in thickness) and an insulator Hf—Al—O layer (11 nm in thickness) (with the $SrBi_2Ta_2O_9$ layer on the Pt side) as a gate insulating structure, and a p-type silicon in the substrate region are illustrated in FIGS. 16(*a*) and 16(*b*). The transistor used in this experiment had a gate length of 3 μm and a gate width of 100 μm. FIG. 16(*a*) illustrates the results of the determination of the electric characteristic showing the dependency of the electric current between the source and drain regions (drain current) of the aforementioned n-channel field-effect transistor on the voltage between the gate conductor and the p-type substrate region. The first voltage was set at −1 V, the second voltage at 3 V, the third voltage at −6 V, and the fourth voltage at 8 V. The ninth voltage was set at 1.8 V. For the experiment, the p-type substrate terminal was grounded and the drain terminal was exposed to a voltage of 0.1 V. In FIG. 16(*a*), the arrowed solid line shows the direction of revolution of the second hysteresis curve and the arrowed broken line shows the direction of revolution of the first hysteresis curve. Then, FIG. 16(*b*) illustrates the results of the determination of the electric characteristic showing the dependency of the electric current between the source and drain regions of the aforementioned n-channel field-effect transistor on the voltage between the source and drain regions. To be specific, S1 denotes the curve determined by changing the potential difference voltage between the gate conductor and the p-type substrate region once to 8 V and then fixing it at 1.8 V, S2 denotes the curve determined by sweeping the potential difference voltage between the gate conductor and the p-type substrate region between −1 V and 3 V and then fixing it at 3 V, and S3 denotes the curve determined by changing the potential difference voltage between the gate conductor and the p-type substrate region once to −6 V and then fixing at 1.8 V.

Figure 17:
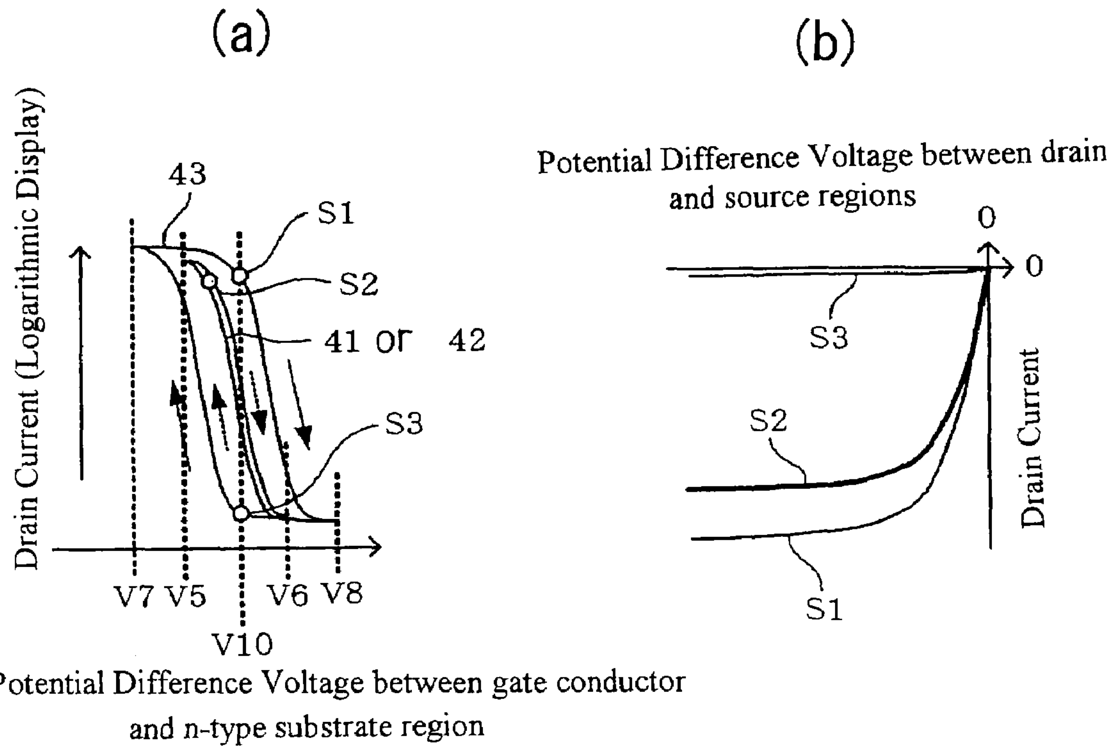
FIGS. 17(*a*) and 17(*b*) They are schematic views of electric characteristics indicating the dependency of the current between the source and drain regions on the voltage between the gate conductor and the n-type substrate region and electric characteristics indicating the dependency of the current between the source and drain regions on the voltage between the source and drain regions in a p-channel field-effect transistor used in the embodiment of this invention.

FIG. 17 is an explanatory view showing in more detail the electric characteristic of the p-channel field-effect transistor capable of electrically switching the logical operation state, memory write state and nonvolatile memory holding state. One example of the electric characteristic showing the dependency of the electric current between the source and drain regions on the voltage between the gate conductor and the n-type substrate region is illustrated in FIG. 17(*a*) and one example of the electric characteristic showing the dependency of the electric current between the source and drain regions on the voltage between the source and drain regions is illustrated in FIG. 17(*b*). In FIG. 17(*a*), the arrowed solid line shows the direction of revolution of the fourth hysteresis curve and the arrowed broken line shows the direction of revolution of the third hysteresis curve. In FIG. 17(*b*), S1 denotes an example of the curve corresponding to the non-volatile ON-memory state assumed by changing the potential difference voltage between the gate conductor and the p-type substrate region once to the seventh voltage V7 and then returning it to the tenth voltage V10, S2 in FIG. 15(*b*) denotes an example of the curve corresponding to the ON state of the logical operation in the non-memory state assumed by changing the potential difference voltage between the gate conductor and the p-type substrate region from the fifth voltage V5 to the sixth voltage V6, and S3 denotes an example of the curve corresponding to the nonvolatile OFF-memory state assumed by changing the potential difference voltage between the gate conductor and the p-type substrate region once to the eighth voltage V8 and then returning it to the tenth voltage V10.

Now, examples of this invention will be described below.

EXAMPLE 1

Figure 18:
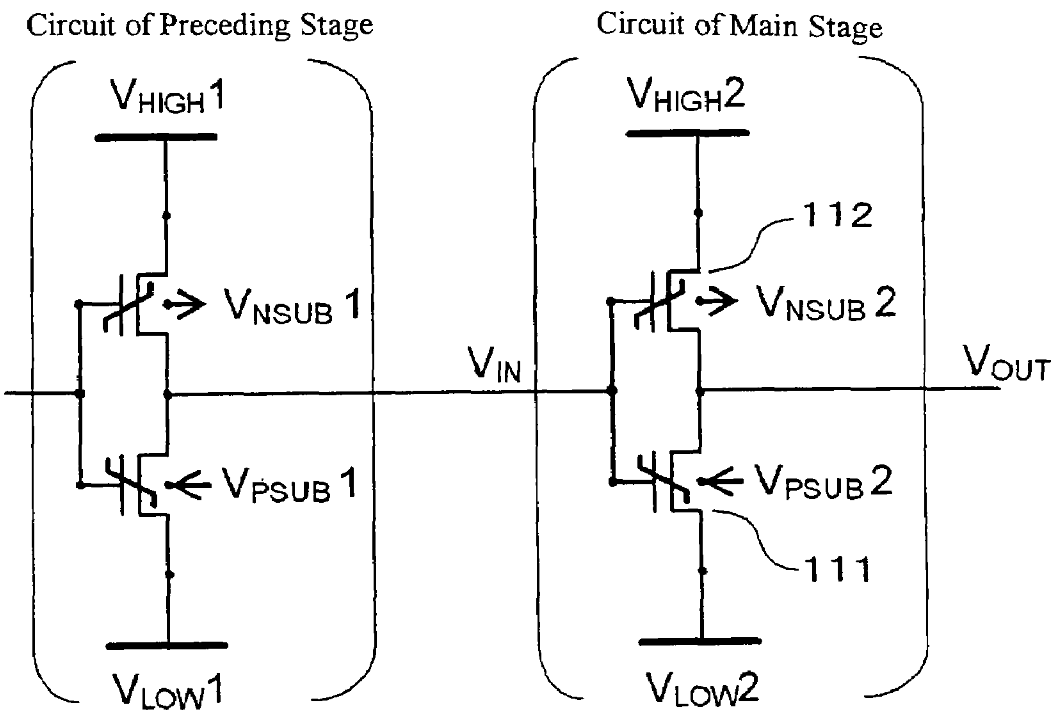
FIG. 18 It shows a NOT logical circuit covered by Example 1 of this invention and an example of the circuit in the stage preceding the NOT logic circuit.

A NOT logical circuit in Example 1 of this invention that is capable of electrically switching the logical operation state, memory write state and nonvolatile memory holding state is illustrated in FIG. 18. When this NOT logical circuit is singly used, an input voltage $V_{IN}$ of the circuit of the main stage can be independently given. On the other hand, when this NOT logical circuit is used as one circuit in a composite circuit, the input voltage $V_{IN}$ of the circuit of the main stage may be set at a value assumed when either of the high power source voltage $V_{HIGH}$ 1 of the circuit of the preceding stage and the low power source voltage $V_{LOW}$ 1 of the circuit of the preceding stage is lowered by the ON resistance between the source and drain regions of the transistor assuming the ON state of the circuit of the preceding stage. In the latter case, the source and drain regions may be regarded as being mutually blocked because generally the OFF resistance between the source and drain regions of the transistor assuming the OFF state of the circuit of the preceding stage is sufficiently large. The input voltage $V_{IN}$ of the circuit of the main stage acquires a potential substantially equal to either of the high power source voltage $V_{HIGH}$ 1 of the circuit of the preceding stage and the low power source voltage $V_{LOW}$ 1 of the circuit of the preceding stage in accordance with the theoretical value of the output of the circuit of the preceding stage. The circuit of the preceding stage is possibly formed of the n-channel field-effect transistor and the p-channel field-effect transistor that are capable of arbitrarily switching the logical operation state, memory write state and nonvolatile memory holding state electrically similarly to the circuit of the main stage. Unlike the circuit of the main stage, it may be formed of the conventional n-channel and p-channel field-effect transistors possessing no nonvolatile memory function.

When the n-channel field-effect transistor 111 forming the circuit of the main stage is the n-channel field-effect transistor possessing the characteristic illustrated in FIG. 5 or FIG. 8 and the p-channel field-effect transistor 112 forming the circuit of the main state is the p-channel field-effect transistor possessing the characteristic illustrated in FIG. 7 or FIG. 9, the high power source voltage $V_{HIGH}$ 1 of the circuit of the preceding stage is made to satisfy $V_{HIGH}$ 1=$V_{CC}$ 1 and the low power source voltage $V_{LOW}$ 1 is made to satisfy $V_{LOW}$ 1=$V_{SS}$ 1 while the circuit of the main stage is in the logical operation state. When the circuit of the main stage is in the course of memory write, $V_{HIGH}$ 1 is made to satisfy $V_{HIGH}$ 1=$V_{CC}$ 2 and $V_{LOW}$ 1 is made to satisfy $V_{LOW}$ 1=$V_{SS}$ 2. On the assumption that $V_{HIGH}$ 1 and $V_{LOW}$ 1 satisfy $V_{HIGH}$ 1=$V_{LOW}$ 1=V0 while the circuit of the main stage is holding nonvolatile record, the relation between the individual values $V_{CC}$ 1, $V_{SS}$ 1, $V_{CC}$ 2 and $V_{SS}$ 2, and the p-type substrate electrode potential $V_{PSUB}$ 2 of the n-channel field-effect transistor forming the circuit of the main stage and the n-type substrate electrode potential $V_{NSUB}$ 2 of the p-channel field-effect transistor forming the circuit of the main stage are expressed as shown below, using the first voltage V1 as the lower limit and the second value V2 as the upper limit respectively of the potential difference voltage between the gate conductor and the p-type substrate region existing while the n-channel field-effect transistor forming the circuit of the main stage is performing the logic operation, the third voltage V3 as the lower limit and the fourth voltage V4 as the upper limit respectively of the potential difference voltage between the gate conductor and the p-type substrate region existing during the course of memory write, the ninth voltage V9 as the fixed value of voltage of the potential difference voltage between the gate conductor and the p-type substrate region existing during the holding of nonvolatile memory, the fifth voltage V5 as the lower limit and the sixth voltage V6 as the upper limit respectively of the potential difference voltage between the gate conductor and the n-type substrate region existing during the logical operation in the p-channel field-effect transistor forming the circuit of the main stage, the seventh voltage V7 as the lower limit and the eighth voltage V8 as the lower limit respectively of the potential difference voltage between the gate conductor and the n-type substrate region existing during the course of memory write, and the tenth voltage V10 as the fixed value of voltage of the potential difference voltage between the gate conductor and the n-type substrate region existing during the holding of nonvolatile memory.

$$V_{CC}1=V2+V_{PSUB}2=V6+V_{NSUB}2,$$

$$V_{SS}1=V1+V_{PSUB}2=V5+V_{NSUB}2,$$

$$V_{CC}2=V4+V_{PSUB}2=V8+V_{NSUB}2,$$

$$V_{SS}2=V3+V_{PSUB}2=V7+V_{NSUB}2 \text{ and}$$

$$V0=V9+V_{PSUB}2=V10+V_{NSUB}2.$$

Figure 19:
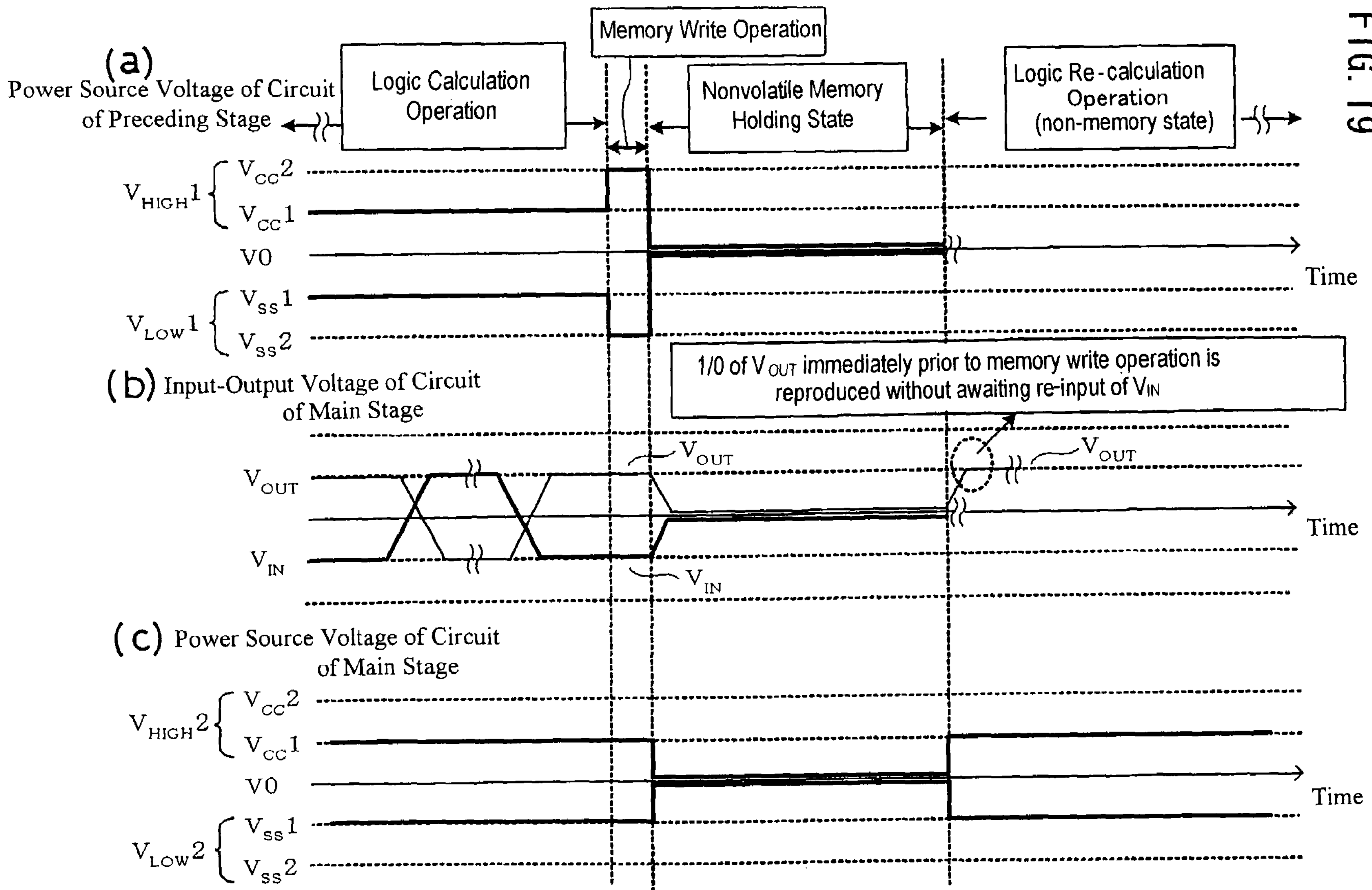
FIGS. 19(*a*), 19(*b*) and 19(*c*) They are waveform diagrams showing the timing of applying the power source voltage for controlling the circuit in the stage preceding the NOT logic circuit of FIG. 18 and the input voltage and the output voltage of the NOT logical operation circuit of the present stage.

One example of the relation that exists in this case between the timing of the NOT logic circuit of FIG. 18 for applying the power source voltage directed to controlling the circuit of the previous stage and the input voltage and the output voltage of the NOT logical operation circuit of the main stage is shown in FIG. 19. Specifically, FIG. 19(*a*) shows the timing of the power source voltage of the circuit of the preceding stage, FIG. 19(*b*) shows the changes in the input-output voltage of the circuit of the main stage and FIG. 19(*c*) shows the timing of the power source voltage of the circuit of the main stage. As shown in FIG. 19(*a*), the power source voltages VHIGH 1 and VLOW 1 of the circuit of the preceding stage respectively assume the values of VCC 1 and VSS 1 while the circuit of the main stage is performing logical calculation operation and utilize the first non-hysteresis curve 21 or the first hysteresis curve 22 of the n-channel field-effect transistor 111 of the circuit of the main stage, namely the n-channel field-effect transistor possessing the characteristic of FIG. 5 or FIG. 8 and the second non-hysteresis curve 41 or the third hysteresis curve 42 of the p-channel field-effect transistor 112 of the circuit of the main stage, namely the p-channel field-effect transistor possessing the characteristic of FIG. 7 or FIG. 9.

The circuit of the main stage, during the course of the memory write, sets the aforementioned voltages $V_{HIGH}$ 1 and $V_{LOW}$ 1 respectively at $V_{CC}$ 2 and $V_{SS}$ 2 and utilizes the second hysteresis curve 23 of the n-channel field-effect transistor 111 of the circuit of the main state, namely the n-channel field-effect transistor possessing the characteristic of FIG. 5 or FIG. 8 and the fourth hysteresis curve 43 of the p-channel field-effect transistor 112 of the circuit of the main stage, namely the p-channel field-effect transistor of FIG. 7 or FIG. 9. When $V_{IN}$ is $V_{CC}$ 1 and $V_{OUT}$ is consequently $V_{LOW}$ 2 immediately prior to the memory write operation, namely when the n-channel field-effect transistor of the circuit of the main stage is in the ON state and the p-channel field-effect transistor is in the OFF state, the n-channel field-effect transistor of the circuit of the main stage that has been in the ON state is made to assume the nonvolatile ON-memory state and the p-channel field-effect transistor of the circuit of the main state that has been in the OFF state is made to assume the nonvolatile OFF-memory state in consequence of the change of $V_{IN}$ from $V_{CC}$ 1 to V0 via $V_{CC}$ 2 induced the memory write operation.

While the circuit of the main stage is holding nonvolatile memory, the NOT logical operation circuit is enabled to electrically change the logical operation state, memory write state and nonvolatile memory holding state as shown in FIG. 19(*b*) by fixing both $V_{HIGH}$ 1 and $V_{LOW}$ 1 at V0. The high power source voltage $V_{HIGH}$ 1 of the circuit of the preceding stage possibly equals the high power source voltage $V_{HIGH}$ 2 of the circuit of the main stage and the low power source voltage $V_{LOW}$ 1 of the circuit of the preceding stage possibly equals the low power source voltage $V_{LOW}$ 2 of the circuit of the main stage.

In the case of making the circuit of the main stage of FIG. 18 start operation again as the logical operation circuit in a logic re-calculation operation (non-memory state), by causing the power source voltages $V_{HIGH}$ 2 and $V_{LOW}$ 2 of the circuit of the main stage of FIG. 18 to be restored to the power source voltages existing when the circuit is operating as the NOT logical operation circuit in the logical operation state immediately before the memory write operation, namely to the voltages respectively satisfying $V_{HIGH}$ 2=$V_{cc}$ 1 and $V_{Low}$ 2=$V_{ss}$ 1, it is made possible to reproduce the source power voltage $V_{OUT}$ of either of the n-channel field-effect transistor and the p-channel field-effect transistor of the circuit of the main stage that has memorized the ON state without awaiting the decision of $V_{IN}$ again by the return of the power source voltage of the circuit of the preceding state as shown in FIG. 19(*b*). Thus, the status 1/0 of the voltage $V_{OUT}$ immediately subsequent to the restart of the operation as the logical operation circuit is digitally judged to equal the status 1/0 of the voltage $V_{OUT}$ immediately prior to the memory write operation. That is, in accordance with Example 1 of this invention, even in the absence of repeated input of the original signal $V_{IN}$, the ON/OFF information of the field-effect transistor situated halfway along the operation circuit can be memorized in a nonvolatile form and reproduced as illustrated in FIG. 19(*b*) and, therefore, the pertinent operation does not need to be started all over again. In the present example, the symbol V0 mentioned above may denote a zero potential. Proper delay of the timing for allowing the power source voltages of the circuit of the preceding stage to recover $V_{HIGH}$ 1=$V_{cc}$ 1 and $V_{LOW}$ 1 =$V_{ss}$ 1 from the timing for allowing the power source voltages of the circuit of the main stage to recover $V_{HIGH}$ 2=$V_{cc}$ 1 and $V_{LOW}$ 2=$V_{ss}$ 1 is effective, depending on the construction and the operation of the circuit. The number of circuits of the main stage to be memorized is not limited and the circuits of the main stage are allowed not only to be dispersed in the integrated circuit but to be continuously placed. In other words, the whole integrated circuit may be made to serve as the circuits of the main stage. In all the circuits of the main stage, the logical operation state, memory write state and nonvolatile memory state can be electrically switched. It suffices that the power source voltage of the circuit of the main state corresponding to the circuit of the preceding stage is changed to $V_{cc}$ 2 and $V_{ss}$ 2 as shown in FIG. 19 and then fixed at V0 during the memory write operation, that the power source voltage of the circuit corresponding to the preceding stage is retained at VO at the time of storing the nonvolatile memory and that the power source voltage of the circuit of the main stage is changed to $V_{cc}$ 1 and $V_{ss}$ as shown in FIG.19. It goes without saying that the circuit corresponding to the preceding stage may constitute the circuit of the main stage when the circuits of the main stage are continuosly arranged.

In accordance with Example 1 of this invention, since an aggregate of identical field-effect transistors can be used both for the logical operation circuit part and for the memory circuit part, it is no longer necessary to have the logical operation circuit part and the memory circuit part disposed at separate places on the same semiconductor substrate and to have the data transferred and evacuated, immediately prior to turning off the power source, to a memory mounted in a mixed state at separated places on the same semiconductor substrate or to a memory mounted on another semiconductor substrate within the same chip package.

EXAMPLE 2

Figure 20:
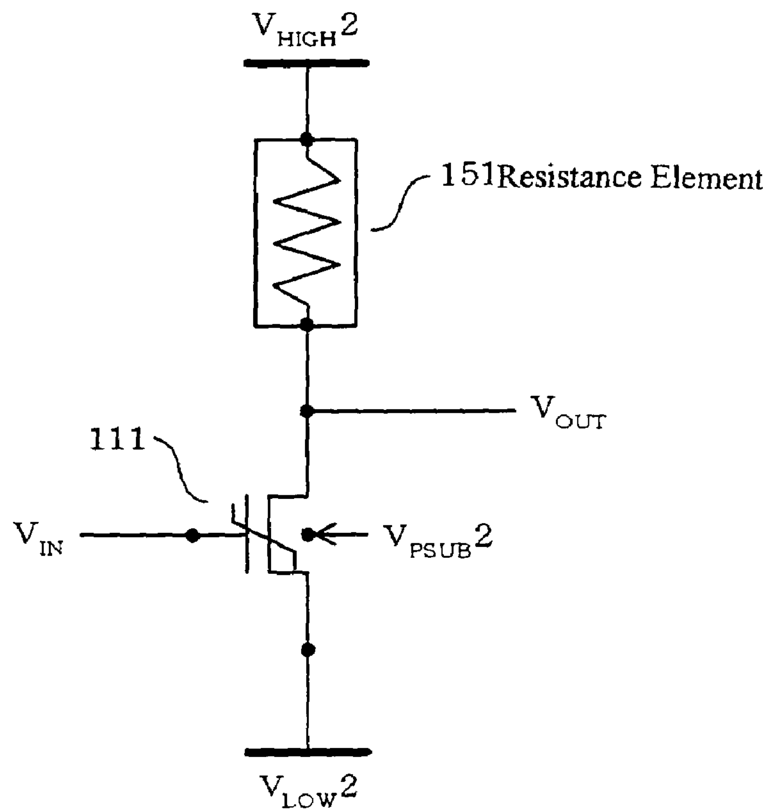
FIG. 20 It is a circuit diagram (Part 1) of the NOT logical circuit covered by Example 2 of this invention.
Figure 21:
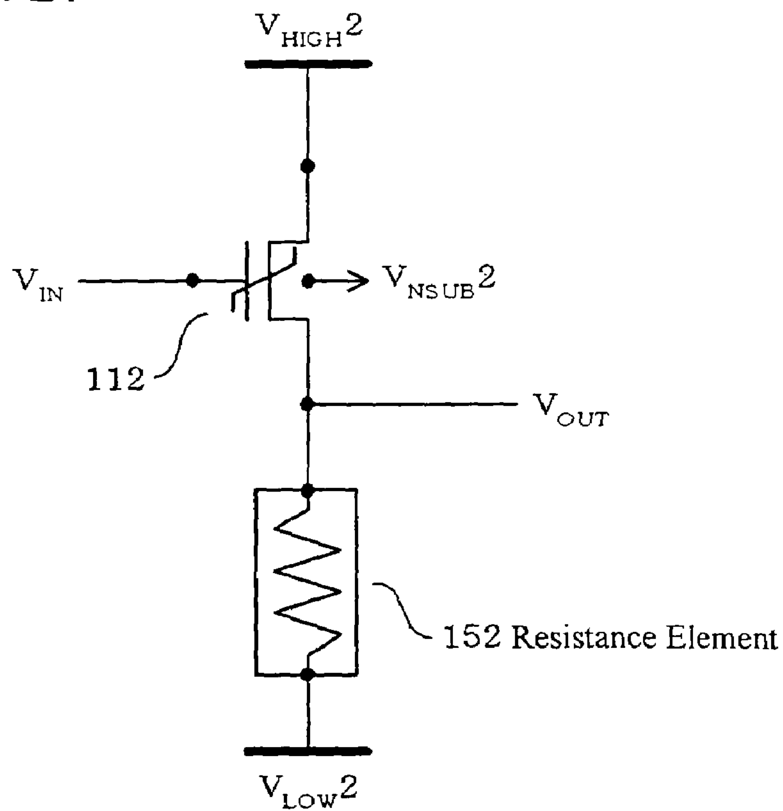
FIG. 21 It is a circuit diagram (Part 2) of the NOT logical circuit covered by Example 3 of this invention.

The NOT logical circuit of the main stage shown in FIG. 18 is constructed, in Example 2, by using the n-channel field-effect transistor 111 or the p-channel field-effect transistor 112 and resistance elements 151 and 152 as illustrated in FIG. 20 and FIG. 21. The term "resistance elements" as used herein refers to resistors in a broad sense of word such as to embrace not only the resistors producing a linear current in response to an applied voltage but also the resistors producing a non-linear current in response to an applied voltage such as, for example, the resistors between the source and drain regions of an ordinary field-effect transistor.

In the case of the circuit of FIG. 20, the value of the resistance of the resistance element 151 prefers to be so small as to fall short of 1/10 of the value of the resistance between the source and the drain regions in the OFF state of the n-channel field-effect transistor of the circuit of FIG. 20 and to be so large as to exceed 10 times the value of the resistance between the source and the drain regions in the ON state. By using the resistance element as illustrated in FIG. 20 in the NOT logical circuit of the main stage of FIG. 18, it is made possible to derive an advantage of simplifying the process of production of the circuit.

Similarly, in the case of the circuit of FIG. 21, the value of the resistance of the resistance element 152 prefers to be so small as to fall short of 1/10 of the value of the resistance between the source and the drain regions in the OFF state of the p-channel field effect transition of the circuit of FIG. 21 and so large as to exceed 10 times the value of resistance between the sour and the drain regions in the ON state. By using the resistance element as illustrated in FIG. 21 in the NOT logic circuit of the main stage of FIG. 18, it is made possible to derive an advantage of simplifying the process of production of the circuit.

EXAMPLE 3

Figure 22:
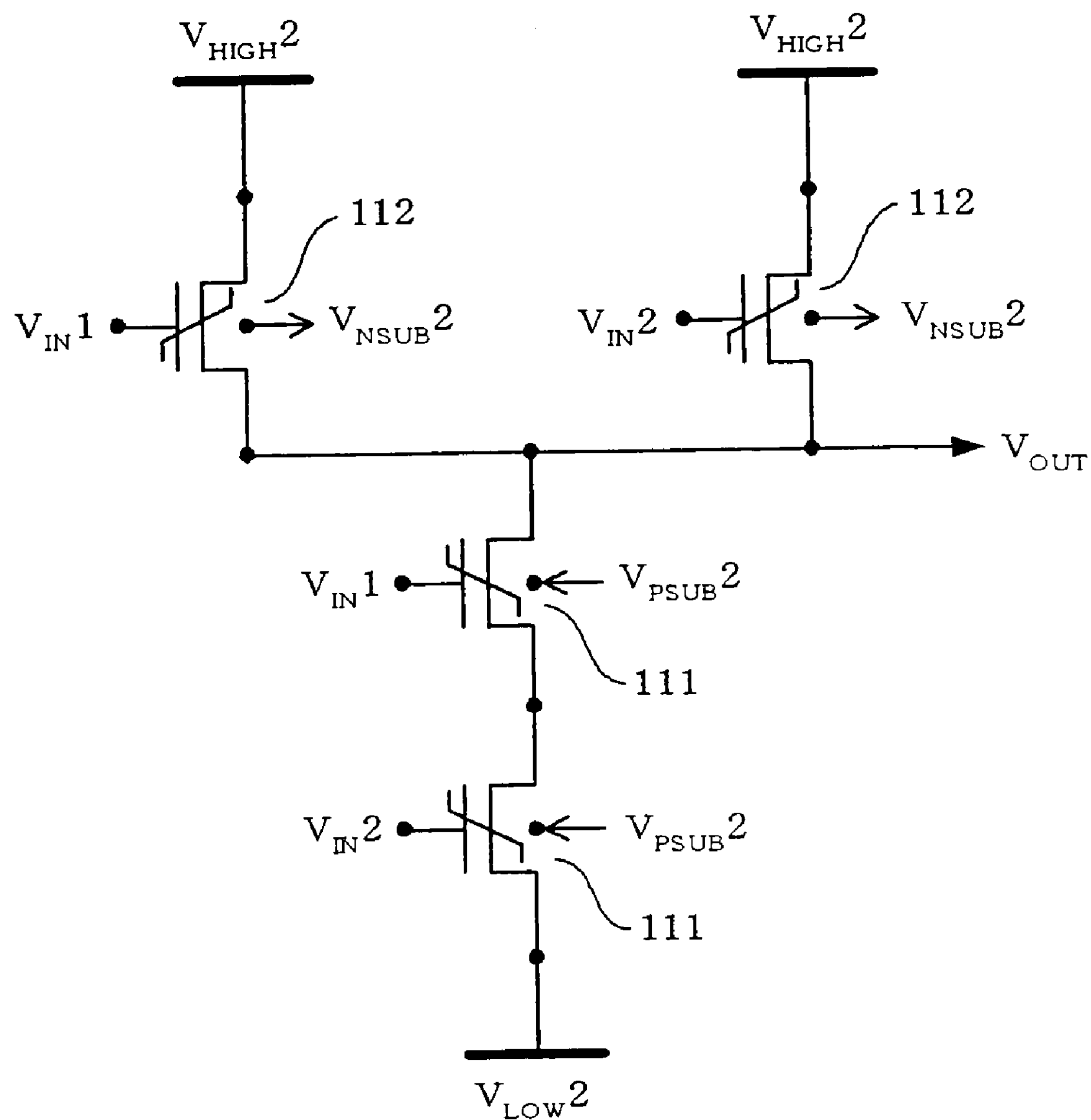
FIG. 22 It is a circuit diagram of the NAND logic circuit covered by Example 3 of this invention.
Figure 23:
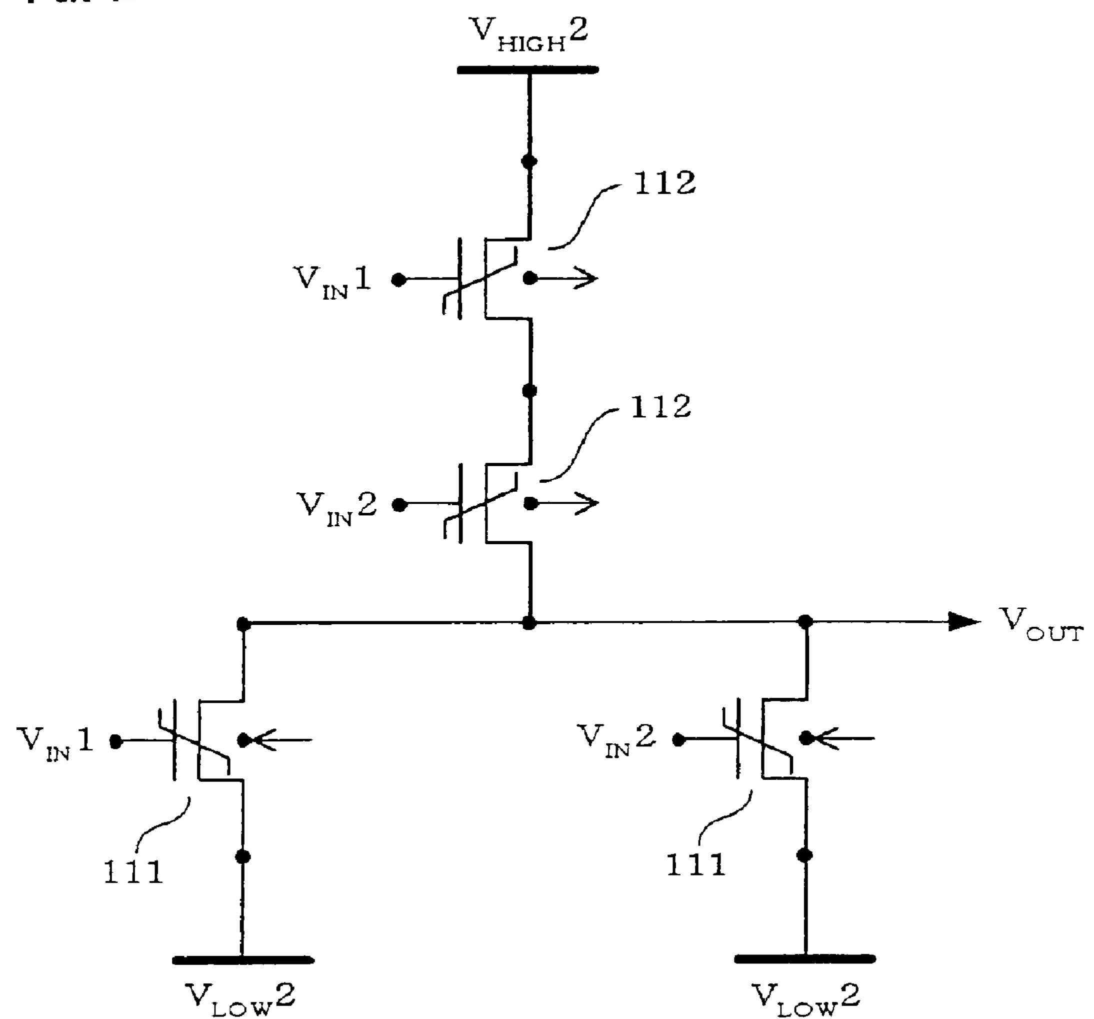
FIG. 23 It is a circuit diagram of the NOR logical circuit covered by Example 3 of this invention.

In Example 3 of this invention, an example of the NAND logical circuit capable of electrically changing the logical operation state, memory write state and nonvolatile memory holding state is shown in FIG. 22 and an example of the NOR logical circuit capable of electrically changing the logical operation state, memory write state and nonvolatile memory holding state is shown in FIG. 23. In the embodiment illustrated in FIG. 23, $V_{HIGH}{}^{2}$ and $V_{LOW}$2 refer to power source voltages.

In the example of the NAND logical circuit and in the example of the NOR logical circuit as well, it is made possible, by controlling the power source voltage of the circuit of the preceding stage similarly to FIG. 19(*a*), to electrically switch the logical operation state, memory write state and nonvolatile memory holding state of the circuit of the main stage and, by building up the power source of the circuit of the main stage again at the time of starting the logical operation, to reproduce the value of $V_{OUT}$ possessing a digitally equivalent 1/0 status and the value $V_{OUT}$ immediately prior to the memory write, according to the memory of the nonvolatile ON or the nonvolatile OFF of the relevant transistor forming the circuit of the main state, without awaiting the re-input of the input voltage $V_{IN}$ 1 and the input voltage $V_{IN}$ 2 to be decided by the output of the circuit of the preceding stage.

In the examples of the logical circuits of NOT, NAND and NOR, the potential of the substrate region of the n-channel field-effect transistor or the p-channel field-effect transistor may be given independently of the potential of the source terminal. The potentials of the individual substrate regions may be connected to the source terminals of the relevant field-effect transistors.

In the examples of the logical circuits of NOT, NAND and NOR possessing the nonvolatile memory function, the potential difference voltage between the gate conductor and the substrate region of the n-channel field-effect transistor or the p-channel field-effect transistor forming such a logical circuit can be controlled not only by varying the gate potential but also by varying the substrate region potential.

The use of the method for applying the power source voltage of FIG. 19(*a*) enables all the logical operation circuits based on the CMOS structure including a flip-flop circuit besides the examples of the logical circuits of NOT, NAND and NOR to be replaced with a logical circuit formed of an n-channel field-effect transistor and a p-channel field-effect transistor capable of electrically switching the logical operation state, memory write state and nonvolatile memory holding state according to this invention.

EXAMPLE 4

Figure 24:
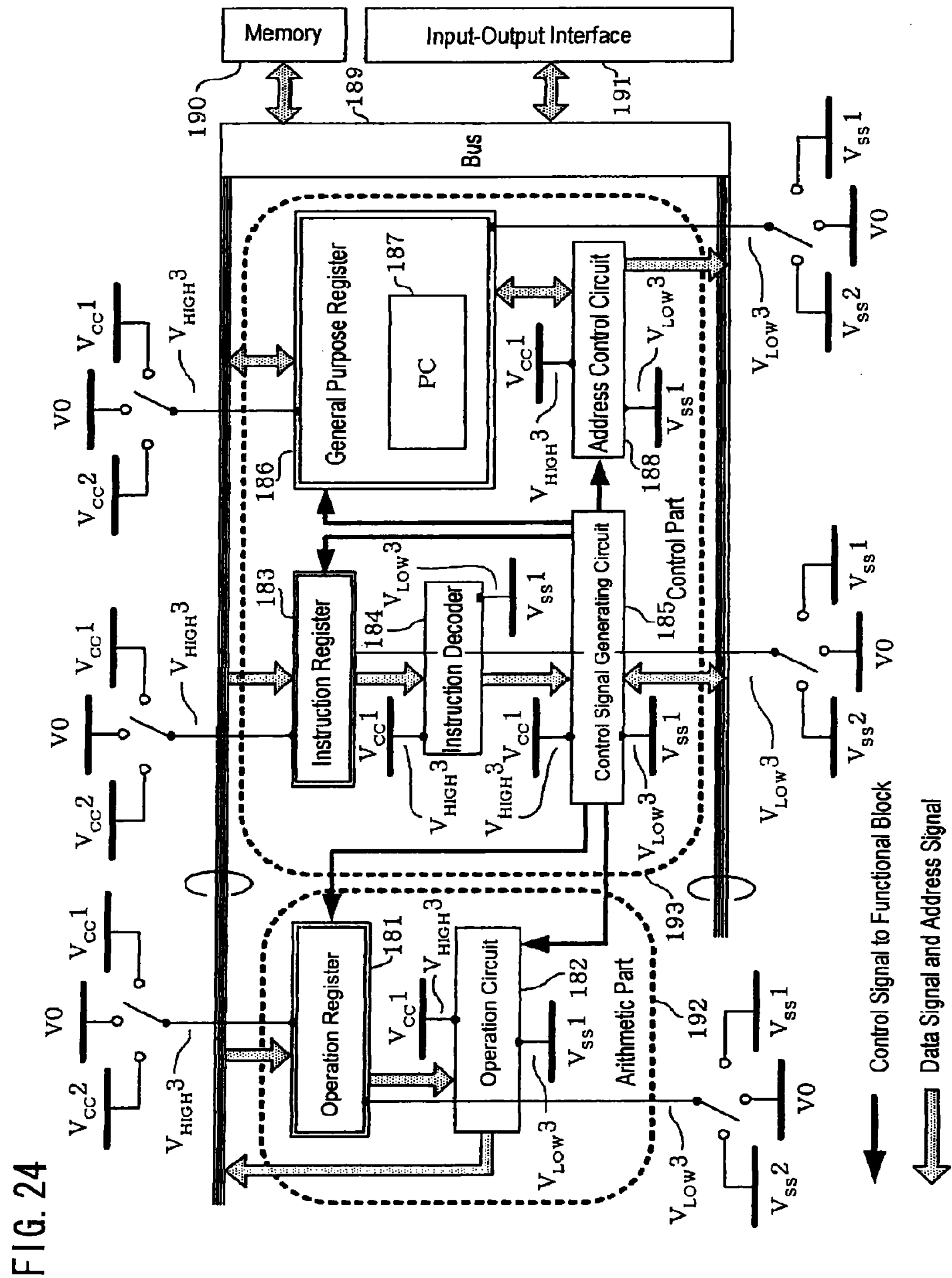
FIG. 24 It is a block diagram illustrating an example of the case of applying this invention to the CPU.

An example of the case of applying this invention to a CPU is illustrated in FIG. 24 as Example 4. In the embodiment illustrated in FIG. 24, $V_{HIGH}$3 and $V_{LOW}$3 refer to power source voltages, heavy lines refer to control signals to functional blocks, and shaded arrows refer to data signals and address signals. The CPU, as broadly sorted, is provided with an operating part 192 consisting of an operation register 181 and an operation circuit 182 and a control part 193 consisting of an instruction register 183, an instruction decoder 184, a control signal generating circuit 185, a general-purpose register 186, a program counter 187 and an address control circuit 188. These component parts interchange data with an external memory 190 and an input-output interface 191 via a bus 189. Either of the operating part 192 and the control part 193 contains a circuit block called a register provided with a memory function.

In the circuit that satisfies the following formulae:

$$V_{CC}1=V2+V_{PSUB}2=V6+V_{NSUB}2,$$

$$V_{SS}1=V1+V_{PSUB}2=V5+V_{NSUB}2,$$

$$V_{CC}2=V4+V_{PSUB}2=V8+V_{NSUB}2,$$

$$V_{SS}2=V3+V_{PSUB}2=V7+V_{NSUB}2 \text{ and}$$

$$V0=V9+V_{PSUB}2=V10+V_{NSUB}2,$$

the n-channel field-effect transistors and the p-channel field-effect transistors capable of arbitrarily switching the logical operation state, memory write state and nonvolatile memory holding state electrically according to this invention are used for the field-effect transistors forming the circuits for temporary storage of the numerical values to be computed from now on, the results of the execution of such computations, the memory addresses of codes being executed at present and the states of the CPU, namely various register circuits such as of the operation register 181, instruction register 183, general-purpose register 186 and the program counter 187 and the power source potentials, namely the aforementioned $V_{CC}$ 2 and $V_{SS}$ 2, necessary for the operation of memory write are wired to the various register circuits such as the operation register 181, instruction register 183, general-purpose register 186 and the program counter 187. As a result, the ON or OFF state of the field-effect transistors forming the various register circuits are written into memories and held in nonvolatile memories without requiring the data in the various register circuits to be transferred to a memory device located at a separated place. Subsequent to the reclosing of the power source, the circuit states of the various register circuits immediately prior to the memory write can be reproduced without requiring the numerical values for the computations to be executed from now on, the results of the execution of these computations, the memory addresses of codes being executed at present and the states of the CPU to be reproduced by the re-input into the various register circuits or the repetition of computations.

By limiting the portions of connection of the power source wiring as described above, it is made possible to enable only part of the circuit blocks in a large-scale circuit to be arbitrarily switched to the logical circuit state, memory write state and nonvolatile memory holding state electrically and consequently to suppress the increase of the layout area due to the wiring of the power sources. Further, since the interim process of a large-scale computation can be put to nonvolatile memory holding at a specific point and, subsequent to the reclosing of the power source, since the computation can be restarted from the memorized information as the starting point, the final result of the computation can be obtained earlier than when the computation is started all over again and the saving of power source consumption can be realized.

According to this invention, the conventional CMOS logical circuit can be wholly replaced with the field-effect transistor capable of nonvolatile memory and the memory circuit as a matter of course can be wholly replaced with the field-effect transistor capable of nonvolatile memory because the field-effect transistor capable of nonvolatile memory itself can form one memory cell. Since this invention enables replacement of the conventional CMOS logical operation circuit and the memory circuit, the duration of design can be shortened by effectively utilizing the assets of design.

According to this invention, the application of the field-effect transistor capable of nonvolatile memory to the memory circuit does not always require numerous memory cells existing in the conventional memory circuit to be arranged in the form of an array and gathered at one place but allows them to be disposed as dispersed directly in a required number at the nodes in the logical circuit that generate such results of computation as necessitates nonvolatile memory. By so doing, it is made possible to attain an efficient layout conforming to the function of the whole circuit because as many memory circuits as are necessary can be disposed as dispersed at necessary places in the circuit.

In accordance with this invention, by making the most of the characteristic that the field-effect transistor can be made to acquire nonvolatile memory capable of electrical rewiring, it is rendered possible to construct a gate array or a logic array with field-effect transistors and consequently manufacture a semi-custom LSI having mounted in a mixed form a logical operation circuit and a memory circuit to be reprogrammed by the application of the voltage from an external terminal even subsequent to the actual mounting on the substrate.

The invention claimed is:

1. A semiconductor integrated circuit including an n-channel field-effect transistor having a gate insulating structure and a gate conductor stacked sequentially in an order mentioned on an n-type source region, an n-type drain region and a p-type substrate region, said n-channel field-effect transistor having electric characteristics, in a graph having an axis of ordinate standing for an absolute value of a drain current and an axis of abscissas standing for a potential difference voltage between the gate conductor and the p-type substrate region, such that a first graphic curve exhibiting dependency of the absolute value of the drain current on the potential difference voltage between the gate conductor and the p-type substrate, which is the potential of the gate conductor relative to the p-type substrate region, draws a first non-hysteresis curve or a first hysteresis curve that is a pseudo non-hysteresis curve when the potential difference voltage between the gate conductor and the p-type substrate region falls between a first voltage and a second voltage and, when the potential difference voltage between the gate conductor and the p-type substrate region falls between a third voltage and a fourth voltage, draws a second hysteresis curve, wherein said drain current is an electric current flowing into the n-type drain region from an external conductor that is connected to the n-type drain region when the n-type drain region is given a positive voltage relative to the n-type source region by the external conductor; in said first non-hysteresis curve, the first graphic curve obtained by increasing the potential difference voltage between the gate conductor and the p-type substrate region from the first voltage to the second voltage because the absolute value of the drain current generated when the second voltage is given is larger than that of the drain current generated when the first voltage is given, meaning that a resistance between the drain and the source is small, coincides with a second graphic curve obtained when the voltage is decreased from the second voltage to the first voltage; in said first hysteresis, the first and second graphic curves approximate but fail to coincide with each other; and in said second hysteresis curve, and a third graphic curve obtained when the potential difference voltage between the gate conductor and the p-type substrate region is increased from the third voltage to the fourth voltage does not coincide with a fourth graphic curve obtained when the voltage is decreased from the fourth voltage to the third voltage, and said semiconductor integrated circuit utilizing both the characteristics of the first non-hysteresis curve or the first hysteresis curve and the second hysteresis curve.

2. A semiconductor integrated circuit according to claim 1, wherein:

the n-channel field-effect transistor has electric characteristics, in the graph having the axis of ordinate standing for the absolute value of the drain current and the axis of abscissa standing for the potential difference voltage between the gate conductor and the p-type substrate region, such that a curve (1) positioned below the first hysteresis curve is drawn between the first voltage and the second voltage when the potential difference voltage between the gate conductor and the p-type substrate region is increased from the third voltage equal to or smaller than the first voltage to the fourth voltage equal to or larger than the second voltage, provided that a case where the third voltage equals the first voltage and the fourth voltage equals the second voltage is excluded, and that a curve (2) positioned above the first non-hysteresis curve or the first hysteresis curve is drawn between the first voltage and the second voltage when the potential difference voltage between the gate conductor and the p-type substrate region is decreased from the fourth voltage to the third voltage, and the second hysteresis curve by combining the curve (1) and the curve (2) is drawn between the third voltage and the fourth voltage.

3. A semiconductor integrated circuit according to claim 1, wherein:

the n-channel field-effect transistor is used as a control transistor utilized as a field-effect transistor drawing a non-hysteresis curve or pseudo non-hysteresis curve and a p-channel field-effect transistor is used as a memory transistor utilized as a field-effect transistor drawing a hysteresis curve, a circuit resulting from connecting a drain terminal of the control transistor to a gate terminal of the memory transistor is used as a unit circuit, the p-channel field-effect transistor having a gate insulating structure and a gate conductor stacked sequentially in an order mentioned on a p-type source region, a p-type drain region and an n-type substrate region, and the p-channel field-effect transistor having electric characteristics, in a graph having an axis of ordinate standing for an absolute value of a drain current and an axis of abscissas standing for a potential difference voltage between the gate conductor and the n-type substrate region, such that a graphic curve exhibiting dependency of the absolute value of the drain current on the potential difference voltage between the gate conductor and the n-type substrate, which is the potential of the gate conductor relative to the n-type substrate region, draws a second non-hysteresis curve or a third hysteresis curve that is a pseudo non-hysteresis curve when the potential difference voltage between the gate conductor and the n-type substrate region falls between a fifth voltage and a sixth voltage and, when the potential difference voltage between the gate conductor and the n-type substrate region falls between a seventh voltage and an eighth voltage, draws a fourth hysteresis curve, wherein said drain current is an electric current flowing into the p-type drain region from an external conductor that is connected to the p-type drain region when the p-type drain region is given a negative voltage relative to the p-type source region by the external conductor; in said second non-hysteresis curve, the graphic curve obtained by increasing the potential difference voltage between the gate conductor and the n-type substrate region from the fifth voltage to the sixth voltage because the absolute value of the drain current generated when the fifth voltage is given is larger than that of the drain current generated when the sixth voltage is given, meaning that a resistance between the drain and the source is small, coincides with a graphic curve obtained when the voltage is decreased from the sixth voltage to the fifth voltage; in said third hysteresis, the two graphic curves approximate but fail to coincide with each other; and in said fourth hysteresis curve, the graphic curve obtained when the potential difference voltage between the gate conductor and the n-type substrate region is increased from the seventh voltage to the eighth voltage does not coincide with the graphic curve obtained when the voltage is decreased from the eighth voltage to the seventh voltage.

4. A semiconductor integrated circuit according to claim 1, wherein:

the n-channel field-effect transistor performs a logical computation operation, a memory write operation and a memory holding operation, a resistance between a drain and a source assumes a high resistance state and a low resistance state in accordance as the potential difference voltage between the gate conductor and the p-type substrate region of the n-channel field-effect transistor assumes a properly low voltage state or high voltage state between the first voltage and the second voltage with time during a logical operation time zone and the n-channel field-effect transistor is regarded as assuming an OFF state in the case of the high resistance state and the n-channel field-effect transistor is in an ON state and decides a height of a drain potential according to a height of a source potential in the case of the low resistance state, during the memory write operation, the potential difference voltage between the gate conductor and the p-type substrate region, while assuming the second voltage immediately prior to starting the memory write operation, is further changed from the second voltage to the fourth voltage, the potential difference voltage between the gate conductor and the p-type substrate region, while assuming the first voltage immediately prior to starting the memory write operation, is further changed from the first voltage to the third voltage to perform the memory write operation, then set the potential difference voltage between the gate conductor and the substrate region at the ninth voltage that is a voltage having a proper fixed value between the third voltage and the fourth voltage, and have the source potential retained at zero or a value near zero or in a released state, during a memory holding time zone, a height of a state of resistance between the drain and the source immediately prior to the memory write operation is digitally memorized in a binary form by retaining the potential difference voltage between the gate conductor and the p-type substrate region at the ninth voltage and having the source potential retained at zero or a value near zero or in a released state, and at the time of a restart of the logical operation, the height of the drain potential is reproduced in accordance with the height of the source potential reproduced at a time of restarting the logical operation by causing the source potential to be returned to the value existing during the logical operation time zone immediately prior to the memory write operation when the resistance between the drain and the source memorized during the memory holding time zone is low, meaning that when the n-channel field-effect transistor has memorized the ON state and, in consequence of the n channel field-effect transistor continuing to retain the OFF state when the resistance between the drain and the source memorized during the memory holding time zone is high, meaning that when the n-channel field-effect transistor has memorized the OFF state, the drain potential immediately prior to the memory write operation is reproduced irrespectively of the ON or OFF state of the n-channel field-effect transistor to enable to impart the potential difference voltage between the gate conductor and the substrate region to any transistors at a next stage and consequently restart the logical operation as an initial state in an ensuing state.

5. A semiconductor integrated circuit according to claim 4, wherein a plurality of said n-channel field-effect transistors are included, and at least one of said n-channel field-effect transistors utilizes both the characteristics of said first non-hysteresis curve or said first hysteresis curve and said second hysteresis curve.

6. A semiconductor integrated circuit according to claim 4, wherein two or more said n-channel field-effect transistors are included, at least one of said n-channel field-effect transistors utilizes the characteristic of said first non-hysteresis curve or said first hysteresis curve, and at least one of other field-effect transistors utilize the characteristic of said second hysteresis curve.

7. A semiconductor integrated circuit according to claim 4, wherein said n-channel field-effect transistors are included in a plural number, and at least one of said n-channel field-effect transistors utilizes the characteristic of said first non-hysteresis curve or said first hysteresis curve.

8. A semiconductor integrated circuit according to claim 4, wherein said n-channel field-effect transistors are included in a plural number, and at least one of said n-channel field-effect transistors utilizes the characteristic of said second hysteresis curve.

9. A semiconductor integrated circuit according to claim 4, wherein a plurality of said n-channel field-effect transistors are included, and at least one of said n-channel field-effect transistors is enabled to utilize said first non-hysteresis curve or said first hysteresis curve exclusively by causing said potential difference voltage between the gate conductor and the p-type substrate region of said field-effect transistor to change only in a range of from said first voltage to said second voltage.

10. A semiconductor integrated circuit according to claim 4, wherein a plurality of said n-channel field-effect transistors are included, and at least one of said n-channel field-effect transistors is enabled to utilize said second hysteresis curve exclusively by causing said potential difference voltage between the gate conductor and the p-type substrate region of said field-effect transistor to change only in a range of from said third voltage and said fourth voltage.

11. A semiconductor integrated circuit according to claim 4, further comprising a p-channel field-effect transistor, wherein a complementary circuit element results from mutually connecting drain terminals and gate terminals of said n-channel field-effect transistor and said p-channel field-effect transistor, said p-channel field-effect transistor having a gate insulating structure and a gate conductor stacked sequentially in an order mentioned on a p-type source region, a p-type drain region and an n-type substrate region, and said p-channel field-effect transistor having electric characteristics, in a graph having an axis of ordinate standing for an absolute value of a drain current and an axis of abscissas standing for a potential difference voltage between the gate conductor and the n-type substrate region, such that a graphic curve exhibiting dependency of the absolute value of the drain current on the potential difference voltage between the gate conductor and the n-type substrate, which is the potential of the gate conductor relative to the n-type substrate region, draws a second non-hysteresis curve or a third hysteresis curve that is a pseudo non-hysteresis curve when the potential difference voltage between the gate conductor and the n-type substrate region falls between a fifth voltage and a sixth voltage and, when the potential difference voltage between the gate conductor and the n-type substrate region falls between a seventh voltage and an eighth voltage, draws a fourth hysteresis curve, wherein said drain current is an electric current flowing into the p-type drain region from an external conductor that is connected to the p-type drain region when the p-type drain region is given a negative voltage relative to the p-type source region by the external conductor; in said second non-hysteresis curve, the graphic curve obtained by increasing the potential difference voltage between the gate conductor and the n-type substrate region from the fifth voltage to the sixth voltage because the absolute value of the drain current generated when the fifth voltage is given is larger than that of the drain current generated when the sixth voltage is given, meaning that a resistance between the drain and the source is small, coincides with a graphic curve obtained when the voltage is decreased from the sixth voltage to the fifth voltage; in said third hysteresis, the two graphic curves approximate but fail to coincide with each other; and in said fourth hysteresis curve, the graphic curve obtained when the potential difference voltage between the gate conductor and the n-type substrate region is increased from the seventh voltage to the eighth voltage does not coincide with the graphic curve obtained when the voltage is decreased from the eighth voltage to the seventh voltage.

12. A semiconductor integrated circuit according to claim 11, wherein:

said n-channel field-effect transistors utilizes both said first non-hysteresis curve or said first hysteresis curve and said second hysteresis curve, said p-channel field-effect transistor utilizes both said second non-hysteresis curve or third hysteresis curve and fourth hysteresis curve and, in the complementary circuit element, a drain-source resistance of one of the n-channel field-effect transistor and the p-channel field-effect transistor is in a low resistance state while a drain-source resistance of an other of the n-channel field-effect transistor and the p-channel field-effect transistor is in a high resistance state during the logical operation time zone and during the memory holding time zone as well.

13. A semiconductor integrated circuit according to claim 11, wherein said complementary circuit element is configured to perform a complementary logical operation of NOT, NAND or NOR, or a composite logical operation combining them.

14. A semiconductor integrated circuit according to claim 4, wherein:

at least one switch circuit element capable of selecting a conduction state and a non-conduction state between an input terminal and an output terminal depending on a state of a control terminal and at least one two-terminal resistance element is included, one of terminals of the resistance elements and the output terminal of said switch circuit element are connected to the gate terminal of said n-channel field-effect transistor and, depending on states of an electric potential of the other of the terminals of said resistance elements and the control terminal of said switch circuit element and the state of the electric potential of the input terminal of said switch circuit, during a logical operation time zone, the high voltage state and the low voltage state of the potential difference voltage between the gate conductor and the p-type substrate region of said n-channel field-effect transistor are arbitrarily selected, and during the memory write operation, the potential difference voltage between the gate conductor and the p-type substrate region of said n-channel field-effect transistor, while in a high voltage state, is further increased or the potential difference voltage between said gate conductor and the p-type region, while in a low voltage state, is further lowered.

15. A semiconductor integrated circuit according to claim 4, wherein:

at least two switch circuit elements are included such that one of said switch circuit elements is in a non-conduction state while an other of the switch circuit elements is in a conduction state, output terminals of said two switch circuit elements are connected to a gate terminal of said n-channel field-effect transistor and, depending on states of control terminals of said two switch circuit elements and the electric potentials of input terminals, during a logical operation time zone, the high voltage state and the low voltage state of the potential difference voltage between the gate conductor and the p-type substrate region of said n-channel field-effect transistor are arbitrarily selected, and during a memory write operation, the potential difference voltage between the gate conductor and the p-type substrate region of said n-channel field-effect transistor, while in a high voltage state, is further increased or the potential difference voltage between the gate conductor and the p-type substrate region, while in a low voltage state, is further lowered.

16. A semiconductor integrated circuit according to claim 14, wherein said n channel field-effect transistor is utilized as a field-effect transistor for drawing a non-hysteresis curve or a pseudo non-hysteresis curve.

17. A semiconductor integrated circuit according to claim 4, wherein:

at least two switch circuit elements are included such that one of said switch circuit elements is in a non-conduction state while an other of the switch circuit elements is in a conduction state, output terminals of said two switch circuit elements are connected to a gate terminal of said p-channel field-effect transistor and, depending on states of the control terminals of said two switch circuit elements and the electric potential of an input terminal, during a logical operation time zone, the high voltage state and the low voltage state of the potential difference voltage between the gate conductor and the n-type substrate region of said p-channel field-effect transistor are arbitrarily selected, and during a memory write operation, the potential difference voltage between the gate conductor and the n-type substrate region of said p-channel field-effect transistor, while in a high voltage state, is further increased or the potential difference voltage between the gate conductor and the n-type substrate region, while in a low voltage state, is further lowered.

18. A semiconductor integrated circuit including a p-channel field-effect transistor having a gate insulating structure and a gate conductor stacked sequentially in an order mentioned on a p-type source region, a p-type drain region and an n-type substrate region, said p-channel field-effect transistor having electric characteristics, in a graph having an axis of ordinate standing for an absolute value of a drain current and an axis of abscissas standing for a potential difference voltage between the gate conductor and the n-type substrate region, such that a graphic curve exhibiting dependency of the absolute value of the drain current on the potential difference voltage between the gate conductor and the n-type substrate, which is the potential of the gate conductor relative to the n-type substrate region, draws a second non-hysteresis curve or a third hysteresis curve that is a pseudo non-hysteresis curve when the potential difference voltage between the gate conductor and the n-type substrate region falls between a fifth voltage and a sixth voltage and, when the potential difference voltage between the gate conductor and the n-type substrate region falls between a seventh voltage and an eighth voltage, draws a fourth hysteresis curve, wherein said drain current is an electric current flowing into the p-type drain region from an external conductor that is connected to the p-type drain region when the p-type drain region is given a negative voltage relative to the p-type source region by the external conductor; in said second non-hysteresis curve, the graphic curve obtained by increasing the potential difference voltage between the gate conductor and the n-type substrate region from the fifth voltage to the sixth voltage because the absolute value of the drain current generated when the fifth voltage is given is larger than that of the drain current generated when the sixth voltage is given, meaning that a resistance between the drain and the source is small, coincides with a graphic curve obtained when the voltage is decreased from the sixth voltage to the fifth voltage; in said third hysteresis, the two graphic curves approximate but fail to coincide with each other; and in said fourth hysteresis curve, the graphic curve obtained when the potential difference voltage between the gate conductor and the n-type substrate region is increased from the seventh voltage to the eighth voltage does not coincide with the graphic curve obtained when the voltage is decreased from the eighth voltage to the seventh voltage, and said semiconductor integrated circuit utilizing both the characteristics of the second non-hysteresis curve or the third hysteresis curve and the fourth hysteresis curve.

19. A semiconductor integrated circuit according to claim 18, wherein:

the p-channel field-effect transistor has electric characteristics, in a graph having the axis of ordinate standing for the absolute value of the drain current and the axis of abscissa standing for the potential difference voltage between the gate conductor and the n-type substrate region, such that a curve (3) positioned above the second non-hysteresis curve or the third hysteresis curve is drawn between the fifth voltage and the sixth voltage when the potential difference voltage between the gate conductor and the n-type substrate region is increased from the seventh voltage equal to or smaller than the fifth voltage to the eighth voltage equal to or larger than the sixth voltage, provided that a case where the seventh voltage equals the fifth voltage and the eighth voltage equals the sixth voltage is excluded and that a curve (4) positioned below the second non-hysteresis curve or the third hysteresis curve is drawn between the fifth voltage and the sixth voltage when the potential difference voltage between the gate conductor and the n-type substrate region is decreased from the eighth voltage to the seventh voltage, and the fourth hysteresis curve by combining the curve (3) and the curve (4) is drawn between the seventh voltage and the eighth voltage.

20. A semiconductor integrated circuit according to claim 18, wherein:

the p-channel field-effect transistor is used as a control transistor utilized as a field-effect transistor drawing a non-hysteresis curve or pseudo non-hysteresis curve and an n-channel field-effect transistor is used as a memory transistor utilized as a field-effect transistor drawing a hysteresis curve, a circuit resulting from connecting a drain terminal of the control transistor to a gate terminal of the memory transistor is used as a unit circuit, the n-channel field-effect transistor having a gate insulating structure and a gate conductor stacked sequentially in an order mentioned on an n-type source region, an n-type drain region and a p-type substrate region, said n-channel field-effect transistor having electric characteristics, in a graph having an axis of ordinate standing for an absolute value of a drain current and an axis of abscissas standing for a potential difference voltage between the gate conductor and the p-type substrate region, such that a first graphic curve exhibiting dependency of the absolute value of the drain current on the potential difference voltage between the gate conductor and the p-type substrate, which is the potential of the gate conductor relative to the p-type substrate region, draws a first non-hysteresis curve or a first hysteresis curve that is a pseudo non-hysteresis curve when the potential difference voltage between the gate conductor and the p-type substrate region falls between a first voltage and a second voltage and, when the potential difference voltage between the gate conductor and the p-type substrate region falls between a third voltage and a fourth voltage, draws a second hysteresis curve, wherein said drain current is an electric current flowing into the n-type drain region from an external conductor that is connected to the n-type drain region when the n-type drain region is given a positive voltage relative to the n-type source region by the external conductor; in said first non-hysteresis curve, the first graphic curve obtained by increasing the potential difference voltage between the gate conductor and the p-type substrate region from the first voltage to the second voltage because the absolute value of the drain current generated when the second voltage is given is larger than that of the drain current generated when the first voltage is given, meaning that a resistance between the drain and the source is small, coincides with a second graphic curve obtained when the voltage is decreased from the second voltage to the first voltage; in said first hysteresis, the first and second graphic curves approximate but fail to coincide with each other; and in said second hysteresis curve, and a third graphic curve obtained when the potential difference voltage between the gate conductor and the p-type substrate region is increased from the third voltage to the fourth voltage does not coincide with a fourth graphic curve obtained when the voltage is decreased from the fourth voltage to the third voltage.

21. A semiconductor integrated circuit according to claim 18, wherein:

the p-channel field-effect transistor performs a logical computation operation, a memory write operation and a memory holding operation, a resistance between a drain and a source assumes a high resistance state and a low resistance state in accordance as the potential difference voltage between the gate conductor and the n-type substrate region of the p-channel field-effect transistor assumes a properly low voltage state or high voltage state between the fifth voltage and the sixth voltage with time during the logical operation time zone and the p-channel field-effect transistor is in an ON state and decides the height of the drain potential according to the height of the source potential in the case of the low resistance state and the p-channel field-effect transistor is regarded as assuming an OFF state in the case of the high resistance state, during the memory write operation, the potential difference voltage between the gate conductor and the n-type substrate region, while assuming the fifth voltage immediately prior to starting the memory write operation, is further changed from the fifth voltage to the seventh voltage, the potential difference voltage between the gate conductor and the n-type substrate region, while assuming the sixth voltage immediately prior to starting the memory write operation, is further changed from the sixth voltage to the eighth voltage to perform the memory write operation, then set the potential difference voltage between the gate conductor and the substrate region at the tenth voltage that is a voltage having a proper fixed value between the seventh voltage and the eighth voltage, and have the source potential retained at zero or a value near zero or in a released state, during the memory holding time zone, the height of the state of resistance between the drain and the source immediately prior to the memory write operation is digitally memorized in a binary form by retaining the potential difference voltage between the gate conductor and the n-type substrate region at the tenth voltage and having the source potential retained at zero or a value near zero or in a released state, at the time of the restart of the logical operation, the height of the drain potential is reproduced in accordance with the height of the source potential reproduced at the time of restarting the logical operation by causing the source potential to be returned to the value existing during the logical operation time zone immediately prior to the memory write operation when the resistance between the drain and the source memorized during the memory holding time zone is low, meaning that when the p-channel field-effect transistor has memorized the ON state and, in consequence of the p-channel field-effect transistor continuing to retain the OFF state when the resistance between the drain and the source memorized during the memory holding time zone is high, meaning that when the p-channel field-effect transistor has memorized the OFF state, the drain potential immediately prior to the memory write operation is reproduced irrespectively of the ON or OFF status of the p-channel field-effect transistor to enable to impart the potential difference voltage between the gate and the substrate region to any transistors at the next stage and consequently restart the logical operation as the initial state in the ensuing state.

22. A semiconductor integrated circuit according to claim 21, wherein a plurality of said p-channel field-effect transistors are included, and at least one of said p-channel field-effect transistors utilizes both the characteristics of said second non-hysteresis curve or said third hysteresis curve and said fourth hysteresis curve.

23. A semiconductor integrated circuit according to claim 21, wherein said p-channel field-effect transistors are included in a plural number, and at least one of said p-channel field-effect transistors utilizes the characteristic of said fourth hysteresis curve.

24. A semiconductor integrated circuit according to claim 21, wherein said p-channel field-effect transistors are included in a plural number, and at least one of said p-channel field-effect transistors utilizes the characteristic of said second non-hysteresis curve or said third hysteresis curve.

25. A semiconductor integrated circuit according to claim 21, wherein a plurality of said p-channel field-effect transistors are included, and at least one of said p-channel field-effect transistors is enabled to utilize said second non-hysteresis curve or said third hysteresis curve exclusively by causing said potential difference voltage between the gate conductor and the n-type substrate region of said field-effect transistor to change only in a range of from said fifth voltage to said sixth voltage.

26. A semiconductor integrated circuit according to claim 21, wherein a plurality of said p-channel field-effect transistors are included, and at least one of said p-channel field-effect transistors is enabled to utilize said fourth hysteresis curve exclusively by causing said potential difference voltage between the gate conductor and the n-type substrate region of said field-effect transistor to change only in a range of from said seventh voltage to said eighth voltage.

27. A semiconductor integrated circuit according to claim 21, wherein two or more of said p-channel field-effect transistors are included, at least one of said p-channel field-effect transistors utilizes the characteristic of said second non-hysteresis curve or said third hysteresis curve, and at least one of other field-effect transistors utilizes the characteristic of said fourth hysteresis curve.

28. A semiconductor integrated circuit according to claim 21, further comprising an n-channel field-effect transistor, wherein a complementary circuit element results from mutually connecting drain terminals and gate terminals of said n-channel field-effect transistor and said p-channel field-effect transistor, said n-channel field-effect transistor having a gate insulating structure and a gate conductor stacked sequentially in an order mentioned on an n-type source region, an n-type drain region and a p-type substrate region, and said n-channel field-effect transistor having electric characteristics, in a graph having an axis of ordinate standing for an absolute value of a drain current and an axis of abscissas standing for a potential difference voltage between the gate conductor and the p-type substrate region, such that a first graphic curve exhibiting dependency of the absolute value of the drain current on the potential difference voltage between the gate conductor and the p-type substrate, which is the potential of the gate conductor relative to the p-type substrate region, draws a first non-hysteresis curve or a first hysteresis curve that is a pseudo non-hysteresis curve when the potential difference voltage between the gate conductor and the p-type substrate region falls between a first voltage and a second voltage and, when the potential difference voltage between the gate conductor and the p-type substrate region falls between a third voltage and a fourth voltage, draws a second hysteresis curve, wherein said drain current is an electric current flowing into the n-type drain region from an external conductor that is connected to the n-type drain region when the n-type drain region is given a positive voltage relative to the n-type source region by the external conductor; in said first non-hysteresis curve, the first graphic curve obtained by increasing the potential difference voltage between the gate conductor and the p-type substrate region from the first voltage to the second voltage because the absolute value of the drain current generated when the second voltage is given is larger than that of the drain current generated when the first voltage is given, meaning that a resistance between the drain and the source is small, coincides with a second graphic curve obtained when the voltage is decreased from the second voltage to the first voltage; in said first hysteresis, the first and second graphic curves approximate but fail to coincide with each other; and in said second hysteresis curve, and a third graphic curve obtained when the potential difference voltage between the gate conductor and the p-type substrate region is increased from the third voltage to the fourth voltage does not coincide with a fourth graphic curve obtained when the voltage is decreased from the fourth voltage to the third voltage.

29. A semiconductor integrated circuit according to claim 28, wherein:

said n-channel field-effect transistors utilizes both said first non-hysteresis curve or said first hysteresis curve and said second hysteresis curve, said p-channel field-effect transistor utilizes both said second non-hysteresis curve or third hysteresis curve and fourth hysteresis curve and, in the complementary circuit element, a drain-source resistance of one of the n-channel field-effect transistor and the p-channel field-effect transistor is in a low resistance state while a drain-source resistance of an other of the n-channel field-effect transistor and the p-channel field-effect transistor is in a high resistance state during the logical operation time zone and during the memory holding time zone as well.

30. A semiconductor integrated circuit according to claim 28, wherein said complementary circuit element is configured to perform a complementary logical operation of NOT, NAND or NOR, or a composite logical operation combining them.

31. A semiconductor integrated circuit according to claim 21, wherein:

at least one switch circuit element capable of selecting a conduction state and a non-conduction state between an input terminal and an output terminal depending on a state of a control terminal and at least one two-terminal resistance element is included, one of the terminals of said resistance element and the output terminal of said switch circuit element are connected to the gate terminal of said p-channel field-effect transistor and, depending on states of the electric potential of other of the terminals of said resistance element and the control terminal of said switch circuit element and the state of the electric potential of the input terminal of said switch circuit, during the logical operation time zone, the high voltage state and the low voltage state of the potential difference voltage between the gate conductor and the n-type substrate region of said p-channel field-effect transistor are arbitrarily selected, and during the memory write operation, the potential difference voltage between the gate conductor and the n-type substrate region of said p-channel field-effect transistor, while in a high voltage state, is further increased or the potential difference voltage between the gate conductor and the n-type substrate region, while in a low voltage state, is further lowered.

32. A semiconductor integrated circuit according to claim 31, wherein said p-channel field-effect transistor is utilized as a field-effect transistor for drawing a non-hysteresis curve or a pseudo non-hysteresis curve.

* * * * *